(12) United States Patent
Wang et al.

(10) Patent No.: US 12,677,562 B2
(45) Date of Patent: Jul. 7, 2026

(54) DISPLAY SUBSTRATE AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Benlian Wang, Beijing (CN); Hongli Wang, Beijing (CN); Wei Zhang, Beijing (CN); Weiyun Huang, Beijing (CN); Ming Hu, Beijing (CN); Youngyik Ko, Beijing (CN); Haijun Qiu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 855 days.

(21) Appl. No.: 17/795,906

(22) PCT Filed: Aug. 31, 2021

(86) PCT No.: PCT/CN2021/115548
§ 371 (c)(1),
(2) Date: Jul. 28, 2022

(87) PCT Pub. No.: WO2022/052834
PCT Pub. Date: Mar. 17, 2022

(65) Prior Publication Data
US 2023/0087603 A1      Mar. 23, 2023

(30) Foreign Application Priority Data

Sep. 10, 2020    (WO) ................ PCT/CN2020/114619
Sep. 29, 2020    (WO) ................ PCT/CN2020/118991

Jun. 25, 2021    (CN) ......................... 202110713216.2

(51) Int. Cl.
*H10K 59/35*          (2023.01)

(52) U.S. Cl.
CPC ......... *H10K 59/353* (2023.02); *H10K 59/351* (2023.02); *H10K 59/352* (2023.02)

(58) Field of Classification Search
CPC ......... H10K 59/35–353; H10K 59/121; H10K 59/122; H10K 59/126; H10K 71/20–236;
(Continued)

(56) References Cited

U.S. PATENT DOCUMENTS 8,994,015 B2    3/2015  Pyon et al.
9,697,760 B2    7/2017  Wang et al.
(Continued)

FOREIGN PATENT DOCUMENTS

CN        104051493 A       9/2014
CN        104282727 A       1/2015
(Continued)

OTHER PUBLICATIONS

Office Action in the corresponding U.S. Appl. No. 17/439,861 ; The Office Action has an issue date of Feb. 7, 2024.
(Continued)

*Primary Examiner* — Eric Manuel Mulero Flores
(74) *Attorney, Agent, or Firm* — Dilworth & Barrese, LLP.; Michael J. Musella, Esq.

(57)          ABSTRACT

A display substrate and a display device are provided. The display substrate includes a first color sub-pixel, a second color sub-pixel, and a third color sub-pixel. Each sub-pixel includes a light-emitting region. Sides of each light-emitting region or extension lines of the sides are sequentially connected to form a polygon. Vertexes of the polygon of at least a part of the sub-pixels have non-overlapped regions
(Continued)

with angle portions of the corresponding light-emitting regions. Corners of the light-emitting region of at least one sub-pixel at least include a first angle portion. An area of a non-overlapped region between the first angle portion and a vertex angle of the polygon corresponding to the first angle portion is greater than an area of a non-overlapped region between each angle portion among at least part of remaining angle portions and a vertex angle of the polygon corresponding to the each angle portion.

18 Claims, 7 Drawing Sheets

(58) Field of Classification Search
CPC . H10K 59/352–353; H10H 29/14–142; H10H 29/34–345
See application file for complete search history.

(56) References Cited

U.S. PATENT DOCUMENTS

| | | | |
|---|---|---|---|
| 10,446,618 | B2 | 10/2019 | Wang et al. |
| 10,720,481 | B2 | 7/2020 | Xiao et al. |
| 10,937,848 | B2 | 3/2021 | Park et al. |
| 11,114,016 | B2 | 9/2021 | Liu et al. |
| 11,189,665 | B2 | 11/2021 | Zhang et al. |
| 11,562,689 | B2 | 1/2023 | Ueno |
| 2005/0248262 | A1 | 11/2005 | Brown Elliott |
| 2012/0033160 | A1 | 2/2012 | Tashiro et al. |
| 2013/0113363 | A1 | 5/2013 | Hong |
| 2013/0234917 | A1 | 9/2013 | Lee |
| 2014/0319479 | A1 | 10/2014 | Park et al. |
| 2014/0319484 | A1 | 10/2014 | Kwon |
| 2015/0015465 | A1 | 1/2015 | Gong |
| 2015/0123952 | A1 | 5/2015 | Kim et al. |
| 2015/0379924 | A1 | 12/2015 | Matsueda et al. |
| 2016/0071910 | A1* | 3/2016 | Sasaki .................. H10K 59/351 257/89 |
| 2016/0078807 | A1 | 3/2016 | Sun et al. |
| 2016/0253943 | A1 | 9/2016 | Wang |
| 2016/0343284 | A1* | 11/2016 | Sun ...................... G09G 3/3225 |
| 2017/0194398 | A1 | 7/2017 | Kim et al. |
| 2017/0317150 | A1 | 11/2017 | Chung et al. |
| 2018/0088260 | A1 | 3/2018 | Jin et al. |
| 2018/0130838 | A1 | 5/2018 | Tian et al. |
| 2018/0158887 | A1 | 6/2018 | Yun et al. |
| 2018/0254304 | A1 | 9/2018 | Hong et al. |
| 2018/0261654 | A1 | 9/2018 | Hwang et al. |
| 2018/0277040 | A1 | 9/2018 | Lee et al. |
| 2018/0342570 | A1 | 11/2018 | Hong et al. |
| 2019/0140030 | A1 | 5/2019 | Huangfu et al. |
| 2019/0252469 | A1* | 8/2019 | Xiao .................... G09G 3/3225 |
| 2019/0355794 | A1 | 11/2019 | Dai et al. |
| 2019/0363310 | A1 | 11/2019 | Nakamura |
| 2019/0393275 | A1 | 12/2019 | Kim et al. |
| 2020/0127060 | A1 | 4/2020 | Li et al. |
| 2020/0168692 | A1 | 5/2020 | Liu et al. |
| 2020/0273924 | A1 | 8/2020 | Xiao et al. |
| 2020/0343318 | A1 | 10/2020 | Li et al. |
| 2020/0357862 | A1 | 11/2020 | Wang et al. |
| 2020/0402442 | A1 | 12/2020 | Liu et al. |
| 2021/0091145 | A1 | 3/2021 | Huangfu et al. |
| 2021/0098539 | A1 | 4/2021 | Zhang et al. |
| 2021/0098540 | A1 | 4/2021 | Chen |
| 2021/0193766 | A1 | 6/2021 | Liu et al. |
| 2021/0335909 | A1 | 10/2021 | Wang et al. |
| 2021/0343800 | A1 | 11/2021 | Zhao |
| 2021/0343801 | A1 | 11/2021 | Wang et al. |
| 2022/0069027 | A1 | 3/2022 | Wang et al. |
| 2022/0208890 | A1 | 6/2022 | Liu et al. |
| 2022/0208891 | A1 | 6/2022 | Liu et al. |
| 2022/0310711 | A1 | 9/2022 | Liu et al. |
| 2022/0328573 | A1 | 10/2022 | Hu et al. |
| 2022/0336539 | A1 | 10/2022 | Luo et al. |
| 2022/0336543 | A1 | 10/2022 | Liu et al. |
| 2022/0352259 | A1 | 11/2022 | Xue et al. |
| 2022/0399530 | A1 | 12/2022 | Han et al. |
| 2023/0006004 | A1 | 1/2023 | Li et al. |
| 2023/0081009 | A1 | 3/2023 | Shi et al. |
| 2023/0087603 | A1 | 3/2023 | Wang et al. |

FOREIGN PATENT DOCUMENTS

| | | | | |
|---|---|---|---|---|
| CN | 204885167 | U | 12/2015 | |
| CN | 205355055 | U | 6/2016 | |
| CN | 106486514 | A | 3/2017 | |
| CN | 107887404 | A | 4/2018 | |
| CN | 207966983 | U | 10/2018 | |
| CN | 207966985 | U | 10/2018 | |
| CN | 207966988 | U | 10/2018 | |
| CN | 207966995 | U | 10/2018 | |
| CN | 108922919 | A | 11/2018 | |
| CN | 208077981 | U | 11/2018 | |
| CN | 109300958 | A | 2/2019 | |
| CN | 109860237 | A | 6/2019 | |
| CN | 109935617 | A | 6/2019 | |
| CN | 208970513 | U | 6/2019 | |
| CN | 109994503 | A | 7/2019 | |
| CN | 110137206 | A | 8/2019 | |
| CN | 110137207 | A | 8/2019 | |
| CN | 110364557 | A | 10/2019 | |
| CN | 110620135 | A | 12/2019 | |
| CN | 111341815 | A * | 6/2020 | ......... H01L 27/3218 |
| CN | 111341817 | A | 6/2020 | |
| CN | 111682056 | A | 9/2020 | |
| CN | 111725289 | A | 9/2020 | |
| CN | 111799320 | A | 10/2020 | |
| CN | 112368840 | A | 2/2021 | |
| CN | 112436029 | A | 3/2021 | |
| CN | 112436030 | A | 3/2021 | |
| CN | 112470287 | A | 3/2021 | |
| CN | 112864215 | A | 5/2021 | |
| CN | 111416048 | B | 9/2022 | |
| JP | 2005-352140 | A | 12/2005 | |
| JP | 2015206988 | A | 11/2015 | |
| KR | 10-2020-0060861 | A | 6/2020 | |
| WO | 2022/052010 | A1 | 3/2022 | |
| WO | 2022052390 | A1 | 3/2022 | |

OTHER PUBLICATIONS

Extended European Search Report issued by the European Patent Office in European Application No. 21865889.6; Mailing Date: Nov. 29, 2023.

Extended European Search Report issued by the European Patent Office in European Application No. 21865575.1; Mailing Date: Dec. 8, 2023.

Office Action in the corresponding U.S. Appl. No. 17/850,172 ; The Office Action has an issue date of Apr. 14, 2023.

Office Action in the corresponding Japanese application No. 2021-577081; The Office Action has an issue date of Apr. 24, 2023.

US Office Action mailed Apr. 9, 2024 in U.S. Appl. No. 17/439,940.

Japanese Office Action in Japanese Patent Application No. 2023-140499 mailed Mar. 11, 2025.

First Office Action of Germany application: 112020007366.1; Mailing Date: Dec. 19, 2025.

* cited by examiner

DISPLAY SUBSTRATE AND DISPLAY DEVICE

The present application claims priority of PCT international application No. PCT/CN2020/118991, filed on Sep. 29, 2020, priority of PCT international application No. PCT/CN2020/114619, filed on Sep. 10, 2020, and priority of Chinese Patent Application No. 202110713216.2, filed on Jun. 25, 2021, and the entire content disclosed by the PCT international application and the Chinese patent application is incorporated herein by reference as part of the present application for all purposes.

TECHNICAL FIELD

At least one embodiment of the present disclosure relates to a display substrate and a display device.

BACKGROUND

Organic Light Emitting Diode (OLED) display device is a self-luminous device with a series of advantages such as high brightness, full viewing angle, fast response speed and flexible display. In an organic light emitting diode display device, the conventional arrangement of red sub-pixels, green sub-pixels and blue sub-pixels can be changed (for example, the virtual pixel method of reducing the number of sub-pixels by sharing part of sub-pixels), and the density of physical sub-pixels can be reduced on the premise of the same resolution of the image.

SUMMARY

At least one embodiment of the present disclosure provides a display substrate and a display device.

At least one embodiment of the present disclosure provides a display substrate, including: a plurality of sub-pixels, including a plurality of first color sub-pixels, a plurality of second color sub-pixels and a plurality of third color sub-pixels. The plurality of first color sub-pixels and the plurality of third color sub-pixels are alternately arranged along a row direction and a column direction to form a plurality of first pixel rows and a plurality of first pixel columns, the plurality of second color sub-pixels are arrayed along the row direction and the column direction to form a plurality of second pixel rows and a plurality of second pixel columns, the plurality of first pixel rows and the plurality of second pixel rows are alternately arranged along the column direction and are shifted from each other in the row direction, and the plurality of first pixel columns and the plurality of second pixel columns are alternately arranged along the row direction and are shifted from each other in the column direction. The plurality of sub-pixels include a plurality of light emitting regions, sides of each light emitting region or extension lines of the sides of each light emitting region are sequentially connected to form a polygon, and a plurality of vertex angles in the polygon of at least part of the plurality of sub-pixels have non-overlapped regions with a plurality of angle portions of a corresponding light emitting region; the plurality of angle portions of the light emitting region of at least one sub-pixel at least include a first angle portion, an area of a non-overlapped region between the first angle portion and a vertex angle of the polygon corresponding to the first angle portion is greater than an area of a non-overlapped region between each angle portion among at least part of remaining angle portions and a vertex angle of the polygon corresponding to the each angle portion.

For example, in embodiments of the present disclosure, angle portions of light emitting regions of each of at least two different color sub-pixels include the first angle portion, and counts of the first angle portions in the at least two different color sub-pixels are different.

For example, in embodiments of the present disclosure, light emitting regions of sub-pixels of a same color have a same area, and light emitting regions of sub-pixels of different colors have different areas.

For example, in embodiments of the present disclosure, sides of the light emitting region of the first color sub-pixel or extension lines of the sides of the light emitting region of the first color sub-pixel are sequentially connected to form a first polygon, sides of the light emitting region of the second color sub-pixel or extension lines of the sides of the light emitting region of the second color sub-pixel are sequentially connected to form a second polygon, sides of the light emitting region of the third color sub-pixel or extension lines of the sides of the light emitting region of the third color sub-pixel are sequentially connected to form a third polygon, and at least two of the first polygon, the second polygon and the third polygon are similar patterns.

For example, in embodiments of the present disclosure, in a same sub-pixel, a shortest distance between two straight sides connected to two ends of the first angle portion is not greater than a length of a connecting line between vertices of two angle portions both adjacent to the first angle portion in the same sub-pixel.

For example, in embodiments of the present disclosure, lengths of the two straight sides connected to the two ends of the first angle portion are not less than 3 microns.

For example, in embodiments of the present disclosure, the light emitting region of at least one sub-pixel with the first angle portion is an axisymmetric pattern, and at least one axis of symmetry in the axisymmetric pattern coincides with a bisector of the first angle portion.

For example, in embodiments of the present disclosure, in a same sub-pixel, a connecting line between vertices of two angle portions both adjacent to the first angle portion divides the same sub-pixel into two parts, and the two parts have different areas.

For example, in embodiments of the present disclosure, in a same sub-pixel, a connecting line between vertices of two angle portions both adjacent to the first angle portion divides the sub-pixel into two parts, and an area ratio of the two parts is in a range of 0.1-10.

For example, in embodiments of the present disclosure, the third color sub-pixel includes the first angle portion, a connecting line between vertices of two angle portions adjacent to the first angle portion divides the third color sub-pixel into a first part and a second part, the first part includes the first angle portion, and an area of the first part is less than an area of the second part; a luminous efficiency of the third color sub-pixel is less than a luminous efficiency of the second color sub-pixel, and the second part of the third color sub-pixel is closer to the second color sub-pixel driven in the same row as the third color sub-pixel and adjacent to the third color sub-pixel.

For example, in embodiments of the present disclosure, a shape of the light emitting region is a shape of the polygon with at least one vertex angle cut off, and the first angle portion is an angle portion of the polygon with a first vertex angle formed by two first sides cut off, and a ratio of a length of a cut-off part of at least one of the two first sides to a length of the first side is in a range of 0.2-0.8.

For example, in embodiments of the present disclosure, one sub-pixel includes the first angle portion, another sub-pixel of a different color adjacent to the one sub-pixel in at least one of the row direction and the column direction does not include the first angle portion, or angle portions included in the light emitting region of the another sub-pixel of a different color are all the first angle portions, a connecting line between geometric centers of light emitting regions of the one sub-pixel and the another sub-pixel of a different color adjacent to the one sub-pixel is not parallel to the row direction or the column direction.

For example, in embodiments of the present disclosure, all of the first color sub-pixel, the second color sub-pixel and the third color sub-pixel include the first angle portions, and sub-pixels of different colors have different counts of first angle portions.

For example, in embodiments of the present disclosure, in at least one kind of the first color sub-pixel, the second color sub-pixel and the third color sub-pixel, angle portions of the light emitting region further include a second angle portion, and a distance between an intersection of two sides connecting two endpoints of the first angle portion or extension lines of the two sides connecting two endpoints of the first angle portion and a geometric center of the light emitting region of the sub-pixel is greater than a distance between an intersection of two sides constituting the second angle portion or extension lines of the two sides constituting the second angle portion and the geometric center.

For example, in embodiments of the present disclosure, a shape of an outer edge of the first angle portion includes a line segment, and a ratio of lengths of the outer edges of the first angle portions in different color sub-pixels is in a range of 0.8-1.2; or the shape of the outer edge of the first angle portion includes an arc, and a ratio of radians of the outer edges of the first angle portions in different color sub-pixels is in a range of 0.8-1.2.

For example, in embodiments of the present disclosure, the second angle portion is an angle portion of the polygon with a second vertex angle formed by two second sides cut off or with a second vertex angle formed by one first side and one second side cut off, and a ratio of a length of a cut-off part of at least one side of the first side and the second side to a length of the at least one side is in a range of 0.05-0.2.

For example, in embodiments of the present disclosure, a shape of an outer edge of the second angle portion includes a line segment, and a ratio of lengths of the outer edges of the second angle portions in different color sub-pixels is in a range of 0.8-1.2; or the shape of the outer edge of the second angle portion includes an arc, and a ratio of radians of the outer edges of the second angle portions in different color sub-pixels is in a range of 0.8-1.2.

For example, in embodiments of the present disclosure, among angle portions of at least part of the light emitting regions, the angle portions other than the first angle portion are the second angel portions.

For example, in embodiments of the present disclosure, at least part of the light emitting regions includes four angle portions, the four angle portions of one color sub-pixel of the first color sub-pixel, the second color sub-pixel and the third color sub-pixel do not include the first angle portion, and the four angle portions of the remaining two color sub-pixels of the first color sub-pixel, the second color sub-pixel and the third color sub-pixel include different counts of the first angle portions; or, the four angle portions of two color sub-pixels of the first color sub-pixel, the second color sub-pixel and the third color sub-pixel include same count of first angle portions, and the four angle portions of the remaining one color sub-pixel include a count of the first angle portions different from the count of the first angle portions of the two color sub-pixels; or, the four angle portions of each of the first color sub-pixel, the second color sub-pixel and the third color sub-pixel include the first angle portions, and different color sub-pixels include different counts of the first angle portions.

For example, in embodiments of the present disclosure, the four angle portions of one color sub-pixel of the first color sub-pixel, the second color sub-pixel and the third color sub-pixel include two, three or four first angle portions, and the four angle portions of at least one of the remaining two color sub-pixels of the first color sub-pixel, the second color sub-pixel and the third color sub-pixel include one first angle portion.

For example, in embodiments of the present disclosure, the four angle portions of one color sub-pixel of the first color sub-pixel, the second color sub-pixel and the third color sub-pixel are all the first angle portions, and the four angle portions of another color sub-pixel of the first color sub-pixel, the second color sub-pixel and the third color sub-pixel include two first angle portions, and the four angle portions of the remaining one color sub-pixel of the first color sub-pixel, the second color sub-pixel and the third color sub-pixel include one first angle portion.

For example, in embodiments of the present disclosure, the four angle portions of two color sub-pixels of the first color sub-pixel, the second color sub-pixel and the third color sub-pixel include one first angle portion, and the four angle portions of the remaining one color sub-pixel of the first color sub-pixel, the second color sub-pixel and the third color sub-pixel include three first angle portions.

For example, in embodiments of the present disclosure, the first color sub-pixel is a red sub-pixel, the second color sub-pixel is a green sub-pixel, and the third color sub-pixel is a blue sub-pixel.

For example, in embodiments of the present disclosure, at least one color sub-pixel of the first color sub-pixel, the second color sub-pixel and the third color sub-pixel includes the first angle portion and the second angle portion, the second angle portion includes an angle portion opposite to the first angle portion, the at least one color sub-pixel includes sub-pixels of a same type, and in the sub-pixels of the same type, directions in which a vertex of the first angle portion points to a vertex of the second angle portion opposite to first angle portion are the same.

For example, in embodiments of the present disclosure, at least one color sub-pixel of the first color sub-pixel, the second color sub-pixel and the third color sub-pixel includes the first angle portion and the second angle portion, the second angle portion includes an angle portion opposite to the first angle portion, the at least one color sub-pixel includes at least two types of sub-pixels, and in different types of sub-pixels, directions in which a vertex of the first angle portion points to a vertex of the second angle portion opposite to the first angle portion are different.

For example, in embodiments of the present disclosure, among sub-pixels of a same color with the different types of sub-pixels, and along at least one of the row direction and the column direction, two sub-pixels adjacent to each other are different types of sub-pixels.

For example, in embodiments of the present disclosure, in two sub-pixels adjacent to each other along at least one of the row direction and the column direction, the directions, in which the vertex of the first angle portion points to the vertex of the second angle portion opposite to first angle portion, are reverse to each other.

For example, in embodiments of the present disclosure, the at least two types of sub-pixels include a first type sub-pixel, a second type sub-pixel, a third type sub-pixel and a fourth type sub-pixel; in the first type sub-pixel and the second type sub-pixel, the directions, in which the vertex of the first angle portion points to the vertex of the second angle portion opposite to first angle portion, are reverse to each other and are parallel to one of the row direction and the column direction; in the third type sub-pixel and the fourth type sub-pixel, the directions, in which the vertex of the first angle portion points to the vertex of the second angle portion opposite to first angle portion, are reverse to each other and are parallel to the other of the row direction and the column direction; the plurality of first pixel rows include first sub-pixel rows and second sub-pixel rows alternately arranged along the column direction, sub-pixels of a same color in the first sub-pixel row include the first type sub-pixels and the second type sub-pixels alternately arranged along the row direction, and sub-pixels of a same color in the second sub-pixel row include the third type sub-pixels and the fourth type sub-pixels alternately arranged along the row direction; the plurality of first pixel columns include first sub-pixel columns and second sub-pixel columns alternately arranged along the row direction, sub-pixels of a same color in the first sub-pixel column include the first type sub-pixels and the second type sub-pixels alternately arranged along the column direction, and sub-pixels of a same color in the second sub-pixel column include the third type sub-pixels and the fourth type sub-pixels alternately arranged along the column direction.

For example, in embodiments of the present disclosure, at least one of the third color sub-pixel and the first color sub-pixel includes the first type sub-pixel, the second type sub-pixel, the third type sub-pixel and the fourth type sub-pixel.

For example, in embodiments of the present disclosure, the third color sub-pixel includes the first type sub-pixel, the second type sub-pixel, the third type sub-pixel and the fourth type sub-pixel, the four angle portions of one color sub-pixel of the third color sub-pixel and the first color sub-pixel include one first angle portion, and the four angle portions of the other color sub-pixel of the third color sub-pixel and the first color sub-pixel include at most three first angle portions; or, the four angle portions of one color sub-pixel of the third color sub-pixel and the first color sub-pixel include two first angle portions, and the four angle portions of the other color sub-pixel of the third color sub-pixel and the first color sub-pixel include two or three first angle portions; or, both the third color sub-pixel and the first color sub-pixel include three first angle portions.

For example, in embodiments of the present disclosure, the four angle portions of at least part of the second color sub-pixels include at least one first angle portion, and the second color sub-pixel includes a fifth type sub-pixel, a sixth type sub-pixel, a seventh type sub-pixel and an eighth type sub-pixel, and in different types of sub-pixels, directions in which the vertex of the first angle portion points to the vertex of the second angle portion opposite to the first angle portion are different; in the fifth type sub-pixel, the sixth type sub-pixel, the seventh type sub-pixel and the eighth type sub-pixel, the directions in which the vertex of the first angle portion points to the vertex of the second angle portion opposite to the first angle portion are respectively a first direction, a second direction, a third direction and a fourth direction, and the first direction, the second direction, the third direction and the fourth direction are all intersected with the row direction and the column direction; the plurality of second pixel rows include third sub-pixel rows and fourth sub-pixel rows alternately arranged along the column direction, the third sub-pixel row includes the fifth type sub-pixels and the sixth type sub-pixels alternately arranged along the row direction, and the fourth sub-pixel row includes the seventh type sub-pixels and the eighth type sub-pixels alternately arranged along the row direction; the plurality of second pixel columns include third sub-pixel columns and fourth sub-pixel columns alternately arranged along the row direction, the third sub-pixel column includes the fifth type sub-pixels and the seventh type sub-pixels alternately arranged along the column direction, and the fourth sub-pixel column includes the sixth type sub-pixels and the eighth type sub-pixels alternately arranged along the column direction.

For example, in embodiments of the present disclosure, the display substrate includes a plurality of first sub-pixel groups, the plurality of first sub-pixel groups are arranged as a plurality of first sub-pixel group rows along the row direction, and adjacent first sub-pixel group rows arranged along the column direction are shifted from each other along the row direction, and at least part of the first sub-pixel groups are surrounded by a circle of first color sub-pixels and second color sub-pixels which are alternately arranged; each first sub-pixel group includes one first color sub-pixel, four second color sub-pixels surrounding the first color sub-pixel and four third color sub-pixels surrounding the first color sub-pixel, and the four second color sub-pixels surrounding the first color sub-pixel and the four third color sub-pixels surrounding the first color sub-pixel are alternately arranged as a circle of sub-pixels; an angle portion, closest to the first color sub-pixel, of at least one color sub-pixel of the third color sub-pixel and the second color sub-pixel is the first angle portion.

For example, in embodiments of the present disclosure, in at least part of the first sub-pixel groups, the four angle portions of the first color sub-pixel are all the first angle portions, the four angle portions of at least part of the second color sub-pixels include two first angle portions, and the four angle portions of at least part of the third color sub-pixels include one first angle portion, angle portions, closet to the first color sub-pixel, of the third color sub-pixel and the second color sub-pixel are the first angle portions.

For example, in embodiments of the present disclosure, the display substrate includes a plurality of second sub-pixel groups, at least one of the plurality of second sub-pixel groups includes one first color sub-pixel and one third color sub-pixel arranged adjacent to each other along one of the row direction and the column direction, and two second color sub-pixels arranged adjacent to each other along the other of the row direction and the column direction; a connecting line between centers of the two second color sub-pixels is intersected with a connecting line between centers of the other two sub-pixels, and the two second color sub-pixels are symmetrically distributed relative to the connecting line between the centers of the other two sub-pixels.

For example, in embodiments of the present disclosure, in at least one of the plurality of second sub-pixel groups, the four angle portions of the third color sub-pixel include at least one first angle portion, and the at least one first angle portion includes an angle portion of the third color sub-pixel farthest from the first color sub-pixel.

For example, in embodiments of the present disclosure, in at least one of the plurality of first pixel rows, directions, in which a vertex of the first angle portion points to a vertex of angle portions opposite to the first angle portions in respective third color sub-pixel points are the same; or, in at least one of the plurality of first pixel columns, directions, in which a vertex of the first angle portion points to a vertex of angle portions opposite to the first angle portions in respective third color sub-pixel points are the same.

For example, in embodiments of the present disclosure, an area of the light emitting region of at least one blue sub-pixel is greater than an area of the light emitting region of at least one red sub-pixel, and the area of the light emitting region of at least one red sub-pixel is greater than an area of the light emitting region of at least one green sub-pixel.

For example, in embodiments of the present disclosure, in at least one of the first color sub-pixel, the second color sub-pixel and the third color sub-pixel, connecting lines between intersections of extension lines of sides of the light emitting region form a rhombus, and a diagonal of the rhombus is parallel to at least one of the row direction and the column direction.

For example, in embodiments of the present disclosure, in one color sub-pixel of the first color sub-pixel, the second color sub-pixel and the third color sub-pixel, connecting lines between intersections of extension lines of sides of the light emitting region form a long strip, and a long axis of the long strip is intersected with both the row direction and the column direction.

At least one embodiment of the present disclosure provides a display device, which includes the display substrate as mentioned above.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

Figure 1:
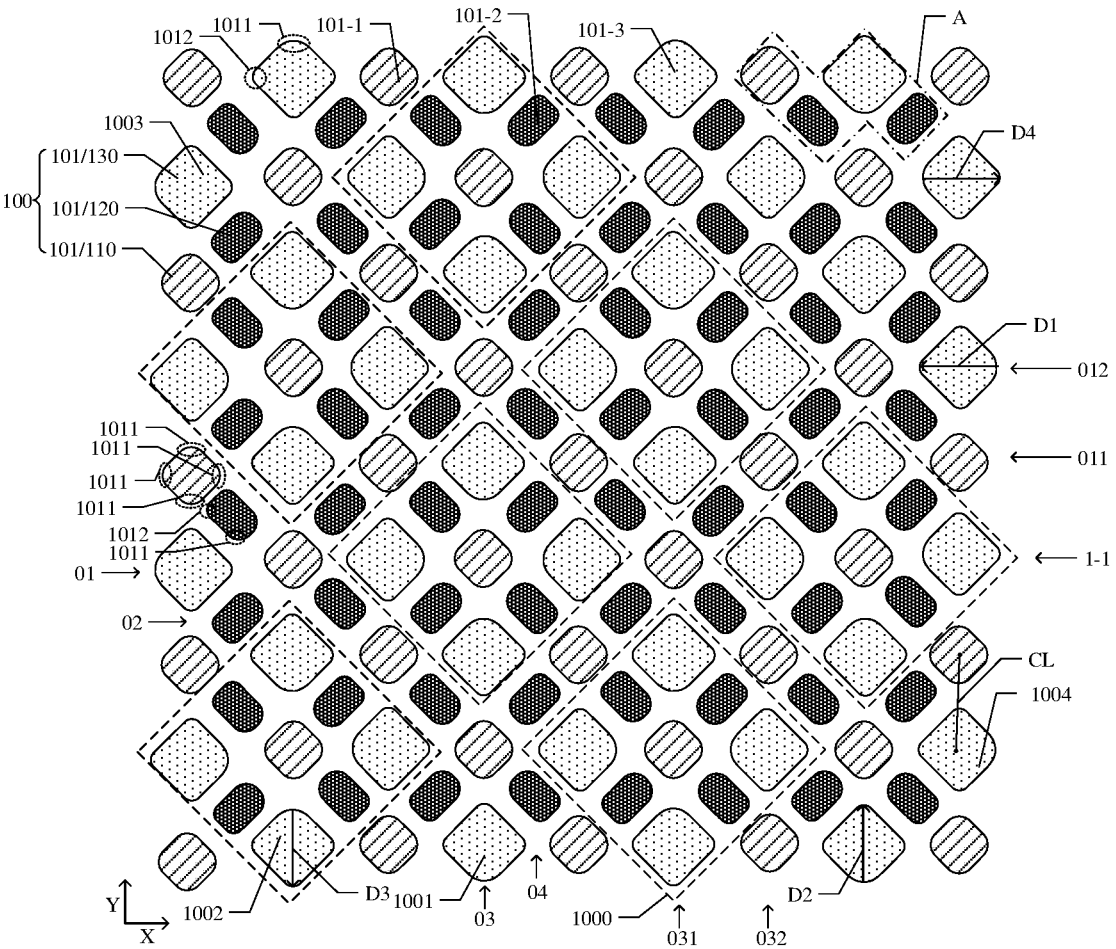
FIG. 1 is a partial planar view of pixel arrangement in a display substrate provided by an example of an embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects.

The embodiments of the present disclosure provide a display substrate and a display device. The display substrate includes a plurality of sub-pixels, which include a plurality of first color sub-pixels, a plurality of second color sub-pixels and a plurality of third color sub-pixels. The plurality of first color sub-pixels and the plurality of third color sub-pixels are alternately arranged along a row direction and a column direction to form a plurality of first pixel rows and a plurality of first pixel columns, the plurality of second color sub-pixels are arrayed along the row direction and the column direction to form a plurality of second pixel rows and a plurality of second pixel columns, the plurality of first pixel rows and the plurality of second pixel rows are alternately arranged along the column direction and are shifted from each other in the row direction, and the plurality of first pixel columns and the plurality of second pixel columns are alternately arranged along the row direction and are shifted from each other in the column direction. The plurality of sub-pixels include a plurality of light emitting regions, sides of each light emitting region or extension lines of the sides of each light emitting region are sequentially connected to form a polygon, and a plurality of vertex angles in the polygon of at least part of the plurality of sub-pixels have regions not overlapped with a plurality of angle portions of a corresponding light emitting region; the plurality of angle portions of the light emitting region of at least one sub-pixel at least include a first angle portion, an area of a region of the first angle portion not overlapped with a vertex angle of the polygon corresponding to the first angle portion is greater than an area of a region of each angle portion among at least part of remaining angle portions not overlapped with a vertex angle of the polygon corresponding to the each angle portion. By setting the first angle portion in at least one sub-pixel, the embodiments of the present disclosure are helpful to adjust the brightness centers of at least part of the display regions to make the distribution of the brightness centers more uniform.

Hereinafter, the display substrate and the display device provided by the embodiments of the present disclosure will be described with reference to the accompanying drawings.

FIG. 1 is a partial planar view of pixel arrangement in a display substrate provided by an example of an embodiment of the present disclosure. As shown in FIG. 1, the display substrate includes a plurality of sub-pixels 100. As shown in FIG. 1, the plurality of sub-pixels 100 include a plurality of first color sub-pixels 110, a plurality of second color sub-pixels 120 and a plurality of third color sub-pixels 130. The plurality of first color sub-pixels 110 and the plurality of third color sub-pixels 130 are alternately arranged along a row direction (X direction as shown in FIG. 1) to form a plurality of first pixel rows 01, the plurality of second color sub-pixels 120 are arranged along the row direction to form a plurality of second pixel rows 02, the first pixel rows 01 and the second pixel rows 02 are alternately arranged along a column direction (Y direction as shown in FIG. 1) intersected with the row direction and are shifted from each other in the row direction. For example, the first color sub-pixel 110 and the second color sub-pixel 120, which are adjacent to each other, are arranged along a first direction, and the first direction is intersected with both the row direction and the column direction. As shown in FIG. 1, the plurality of first color sub-pixels 110 and the plurality of third color sub-pixels 130 are alternately arranged along the column direction to form a plurality of first pixel columns 03, and the plurality of second color sub-pixels 120 are arrayed along the row direction and the column direction to form a plurality of second pixel rows 02 and a plurality of second pixel columns 04, the plurality of first pixel columns 03 and the plurality of second pixel columns 04 are alternately arranged along the row direction and are shifted from each other in the column direction. That is, the second pixel row 02 where one second color sub-pixel 120 is located is between two adjacent first pixel rows 01, and the second pixel column 04 where the second color sub-pixel 120 is located is between two adjacent first pixel columns 03.

In the embodiments of the present disclosure, both the row direction and the column direction refer to arrangement directions of the first color sub-pixel and the third color sub-pixel, which may or may not be parallel to the direction of the connecting line between geometric centers of the light emitting regions of the two adjacent sub-pixels. For example, the row direction is intersected with the column direction. For example, the angle between the row direction and the column direction can be in the range of 80-100 degrees. For example, the angle between the row direction and the column direction can be in the range of 85-95 degrees. For example, the row direction and the column direction can be perpendicular to each other, but not limited thereto, or they may not be perpendicular to each other. In the embodiments of the present disclosure, the row direction and the column direction can be interchanged.

As shown in FIG. 1, the display substrate includes a plurality of repeating units A arranged in an array; each repeating unit A includes sub-pixels of two rows and four columns, that is, each repeating unit A includes one first color sub-pixel 110, one third color sub-pixel 130 and two second color sub-pixels 120; the first color sub-pixel 10 and the third color sub-pixel 130 are shared sub-pixels, and these four sub-pixels can realize the display of two virtual pixel units by virtual algorithm. For example, in the same row of repeating units, the first color sub-pixel 110 in the second repeating unit, the third color sub-pixel 130 in the first repeating unit, and the second color sub-pixel 120 which is in the first repeating unit and close to the second repeating unit form one virtual pixel unit, while the first color sub-pixel 110 in the second repeating unit also forms one virtual pixel unit with the third color sub-pixel 130 in the second repeating unit, as well as the second color sub-pixel 120 in the second repeating unit and close to the first repeating unit; and in addition, the third color sub-pixel 130 in the second repeating unit forms one virtual pixel unit with the other second color sub-pixel 120 in the second repeating unit and the first color sub-pixel 110 in the third repeating unit, so that the resolution of the display substrate can be effectively improved.

The sub-pixel in the embodiments of the present disclosure refers to a light emitting device structure, and the first color sub-pixel, the second color sub-pixel and the third color sub-pixel are sub-pixels emitting light of different colors. The embodiments of the present disclosure are illustrated by taking that the first color sub-pixel is a red sub-pixel, the second color sub-pixel is a green sub-pixel and the third color sub-pixel is a blue sub-pixel as an example. However, the case in which the first color sub-pixel is a red sub-pixel, the second color sub-pixel is a green sub-pixel and the third color sub-pixel is a blue sub-pixel, does not limit the protection scope of the embodiments of the present disclosure.

For example, the first color sub-pixel 110 and the third color sub-pixel 130 are shared sub-pixels, and the areas of the first color sub-pixel 110 and the third color sub-pixel 130 are greater than the area of the second color sub-pixel 20 according to their luminescent spectra.

For example, the area of the light emitting region of at least one blue sub-pixel is greater than the area of the light emitting region of at least one red sub-pixel, and the area of the light emitting region of at least one red sub-pixel is greater than the area of the light emitting region of at least one green sub-pixel, so as to prolong the service life of the display substrate. For example, the areas of light emitting regions of sub-pixels of the same color are basically equal.

Figure 2:
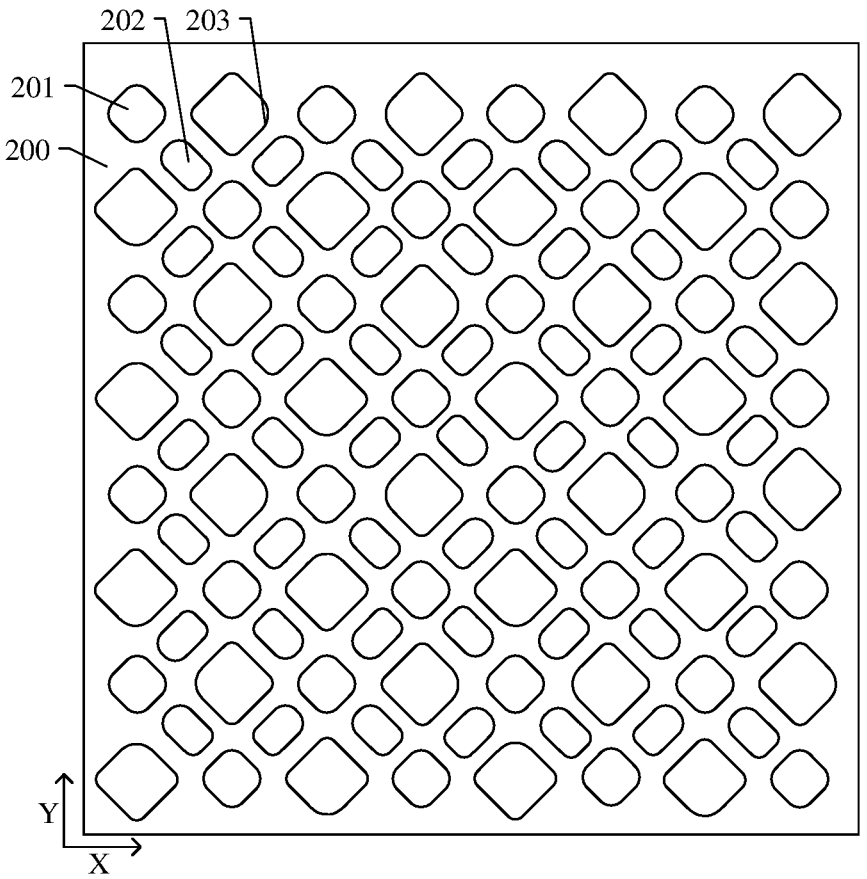
FIG. 2 is a planar structural view of part of a pixel defining layer corresponding to the pixel structure shown in FIG. 1.

As shown in FIG. 1, each sub-pixel 100 includes a light emitting region 101. For example, FIG. 2 is a planar structural view of part of a pixel defining layer corresponding to the pixel structure shown in FIG. 1. As shown in FIG. 1 and FIG. 2, the display substrate is provided with a pixel defining layer 200, and the shape of the light emitting region 101 of each sub-pixel 100 is defined by the opening in the pixel defining layer 200, so that the shape of the light emitting region 101 of each sub-pixel 100 is approximately the same as the shape of the opening of the pixel defining layer 200.

For example, as shown in FIG. 1 and FIG. 2, the pixel defining layer 200 includes a plurality of first openings 201, a plurality of second openings 202 and a plurality of third openings 203. The first opening 201 defines the first light emitting region 101-1 of the first color sub-pixel 110, the second opening 202 defines the second light emitting region 101-2 of the second color sub-pixel 120, and the third opening 203 defines the third light emitting region 101-3 of the third color sub-pixel 130.

For example, the display substrate includes a base substrate, and the sub-pixels 100 and the pixel defining layer 200 are disposed on the base substrate. Each sub-pixel 100 includes an organic light emitting element, and the organic light emitting element includes a first electrode, a light emitting layer and a second electrode which are stacked, and the second electrode is located at one side of the light emitting layer facing the base substrate. For example, at least part of the second electrode is located at one side of the pixel defining layer facing the base substrate. In the case where the light emitting layer is formed in the opening of the pixel defining layer 200, the first electrode and the second electrode, which are located at both sides of the light emitting layer, can drive the light emitting layer in the opening of the pixel defining layer 200 to emit light. For example, a functional layer is further provided between the light emitting layer and the first electrode, and/or between the light emitting layer and the second electrode. For example, the functional layer includes any one or more layers of a hole injection layer, a hole transport layer, an electron transport layer, a hole blocking layer, an electron blocking layer, an electron injection layer, an auxiliary light emitting layer, an interface improvement layer, an anti-reflection layer, etc.

The embodiments of the present disclosure illustratively show that the shape of the opening of the pixel defining layer is a rounded pattern, so the shape of the light emitting region of each sub-pixel is also a rounded pattern. For example, the shape of the second electrode (e.g., anode) of each sub-pixel can also be a rounded pattern. The pattern of the opening of the pixel defining layer can include four straight sides, and at least two adjacent straight sides are connected by a curved segment, which forms a rounded corner. However, it is not limited thereto, and the pattern of the light emitting region of each sub-pixel can also include three straight sides, five straight sides or six straight sides, so the number of vertex angles included in the light emitting region will also change.

For example, the orthographic projection of the opening of the pixel defining layer on the base substrate is located within the orthographic projection of a corresponding light emitting layer on the base substrate, that is, the light emitting layer covers the opening of the pixel defining layer. For example, the area of the light emitting layer is greater than the area of the corresponding opening of the pixel defining layer, that is, the light emitting layer includes at least a part covering the physical structure of the pixel defining layer in addition to the part at the inner side of the opening of the pixel defining layer. Generally, the physical structure of the pixel defining layer at each boundary of the opening of the pixel defining layer is covered by the light emitting layer.

For example, the light emitting layers of the first color sub-pixel 110 and the third color sub-pixels 130 adjacent to each other may or may not overlap with each other on the pixel defining layer 200. For example, the light emitting layers of the first color sub-pixel 110 and the second color sub-pixel 120 adjacent to each other may or may not overlap with each other on the pixel defining layer 200. For example, the light emitting layers of the second color sub-pixel 120 and the third color sub-pixels 130 adjacent to each other may or may not overlap with each other on the pixel defining layer 200. For example, in the direction parallel to the XY plane, the shortest distance between the vertex of the first angle portion 1011 and the boundary of the light emitting layer is less than the shortest distance between the vertex of any other angle portion and the boundary of the light emitting layer.

Figure 3:
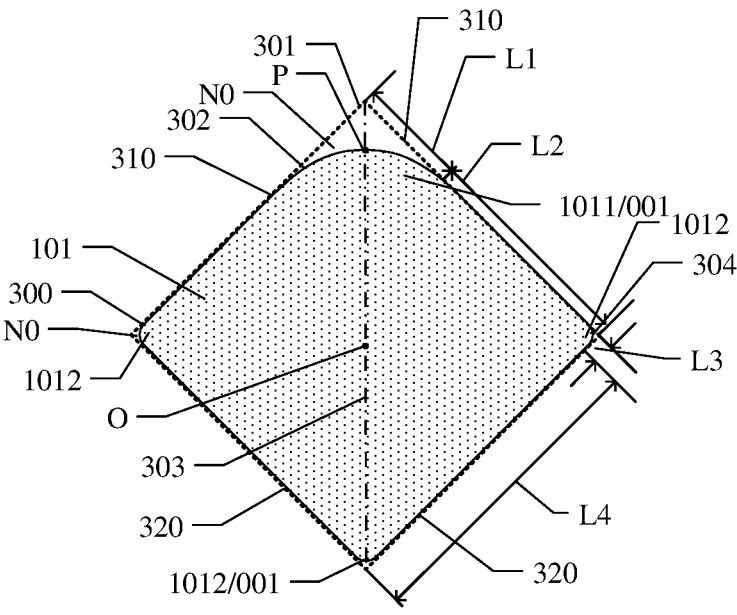
FIG. 3 is a schematic diagram of a shape of one light emitting region shown in FIG. 1.

FIG. 3 is a schematic diagram of the shape of a light emitting region shown in FIG. 1. As shown in FIG. 1 and FIG. 3, the sides of each light emitting region 101 or the extension lines of the sides of each light emitting region 101 are sequentially connected to form a polygon 300, and a plurality of vertex angles 301 in the polygon 300 of at least part of the sub-pixels have regions N0 not overlapped with a plurality of angle portions 001 of the corresponding light emitting region 101; the plurality of angle portions 001 of the light emitting region 101 of at least one sub-pixel at least comprise a first angle portion 1011, and the area of the non-overlapped region N0 between the first angle portion 1011 and the vertex angle 301 of the polygon 300 corresponding to the first angle portion 1011 is greater than the area of the non-overlapped region N0 between each angle portion 001 among at least part of remaining angle portions 001 and the vertex 301 of the polygon 300 corresponding to the each angle portion 001.

For example, FIG. 3 illustratively shows that all the vertex angles of the polygon 300 have non-overlapped regions N0 with the corresponding angle portions 001 of the corresponding light emitting regions 101, but it is not limited thereto, and it can also be that some vertex angles of the polygon have non-overlapped regions with the corresponding angle portions of the light emitting region, and some other vertex angles are completely overlapped with the corresponding angle portions of the light emitting region.

For example, as shown in FIG. 1 and FIG. 3, in at least two different color sub-pixels 100 (e.g., the first color sub-pixel and the second color sub-pixel, or the first color sub-pixel and the third color sub-pixel, or the second color sub-pixel and the third color sub-pixel, or the first color sub-pixel, the second color sub-pixel and the third color sub-pixel), the light emitting region 101 has a shape of the polygon 300 with at least one first vertex angle 301 cut off. For example, the cutting line 302 used to cut off the first vertex angle 301 of the polygon 300 can include a regular line segment, such as a curve or straight line, and can also include an irregular line segment.

For example, the embodiments of the present disclosure illustratively show that the polygon 300 is a quadrilateral. For example, the shape of the polygon corresponding to at least one color sub-pixel can be a rhombus, a rectangle or a square, but not limited thereto, and the shape of the polygon 300 can also be a triangle, a pentagon, or a hexagon, etc., without being limited by the embodiments of the present disclosure. For example, the angle degrees of the vertex angles of the polygon can be equal or unequal.

As shown in FIG. 1 and FIG. 3, the angle portions of the light emitting region 101 include a first angle portion 1011, and the first angle portion 1011 is an angle portion of the polygon 300 with a first vertex angle 301 formed by two first sides 310 cut off. For example, the ratio of the length of the cut-off part L1 of at least one of the two first sides 310 to the length of the first side 310 is in the range of 0.2-0.8. After a first line segment L1 is cut off from the first side 310 of the polygon 300, a retained part L2 of the first side 310 of the polygon 300 forms a side connecting the light emitting region 101 of the first angle portion 1011. For example, both ends of the first angle portion 1011 are connected with two straight sides of the light emitting region 101, and at least one straight side of the two straight sides is a straight side retained after the first line segment L1 is cut off from the first side 310 of the polygon 300.

For example, at least one first vertex angle 301 can be cut off from the polygon 300 to form at least one first angle portion 1011. For example, a polygon 300 includes a plurality of first vertex angles 301 with equal angle degrees, and parameters, such as shape and size, of the plurality of first angle portions 1011 formed by cutting off the plurality of first vertex angles 301 are all equal.

As shown in FIG. 1 and FIG. 3, the ratio of the length of the first line segment L1 to the length of the first side 310 is in the range of 0.2-0.8. For example, the ratio of the length of the first line segment L1 to the length of the first side 310 is in the range of 0.3-0.7. For example, the ratio of the length of the first line segment L1 to the length of the first side 310 is in the range of 0.4-0.6. For example, the ratio of the length of the first line segment L1 to the length of the first side 310 is 0.5.

For example, as shown in FIG. 1 and FIG. 3, the ratio of the length of the first line segment L1 to the length of the retained part L2 is in the range of 0.25-4. For example, the ratio of the length of the first line segment L1 to the length of the retained part L2 is in the range of 1-3. The ratio of the length of the first line segment L1 to the length of the retained part L2 is in the range of 0.5-2.

For example, as shown in FIG. 1 and FIG. 3, the at least two different color sub-pixels 100 have different counts of first angle portions 1011. For example, two different color sub-pixels 100 having different counts of first angle portions 1011 can mean that the counts of first angle portions in sub-pixels of the same color are the same, and in two different color sub-pixels, the count of first angle portions in one sub-pixel is different from the count of first angle portions in the other sub-pixel with a different color. For example, two different color sub-pixels 100 having different counts of first angle portions 1011 can also mean that the counts of first angle portions in sub-pixels of the same color are the same, and the counts of different color sub-pixels are different, so that the total counts of first angle portions included in different color sub-pixels are different.

For example, as shown in FIG. 1 and FIG. 3, the counts of first angle portions 1011 in at least two different color sub-pixels 100 are different, which is helpful to adjust the brightness centers in at least part of the display regions to make the distribution of the brightness centers more uniform.

For example, as shown in FIG. 1, the areas of the light emitting regions 101 of sub-pixels 100 with the same color are the same, and the areas of light emitting regions 101 of sub-pixels 100 with different colors are different.

For example, in the case where the light emitting region 101 includes one first angle portion 1011, the geometric center of the light emitting region 101 is located at one side, away from the first angle portion 1011, of the midpoint of the connecting line 303 between the vertices of the first vertex angle 301 and the vertex angle opposite to the first angle portion 1011. Therefore, by adjusting the geometric centers of at least part of the light emitting regions, the brightness centers in at least part of the display regions can be adjusted to make the distribution thereof more uniform.

For example, as shown in FIG. 1 and FIG. 3, in the display substrate provided by the embodiments of the present disclosure, by adjusting the shapes of some sub-pixels, in at least two color sub-pixels of the first color sub-pixel, the second color sub-pixel and the third color sub-pixel, the distance, between the intersection of the extension lines of two straight sides connected with both ends of the first angle portion and the geometric center of the light emitting region of the sub-pixel, is different from the distance, between the intersection of two straight sides forming an angle portion of the light emitting region opposite to the first angle portion or extension lines thereof and the geometric center of the light emitting region of the sub-pixel, so as to adjust the actual brightness center of each virtual pixel unit and make the actual brightness centers in the display substrate more evenly distributed.

For example, the number of first angle portions 1011 in one color sub-pixel 100 is one, and the number of first angle portions 1011 in another color sub-pixel 100 is greater than one, such as two, three or four. For example, the number of first angle portions 1011 in one color sub-pixel 100 can be two, and the number of first angle portions 1011 in another color sub-pixel 100 can be three or four. For example, the number of first angle portions 1011 in one color sub-pixel 100 can be three, and the number of first angle portions 1011 in another color sub-pixel 100 can be four. The counts of first angle portions of different color sub-pixels are not limited in the embodiments of the present disclosure, and can be set according to the actual product requirements.

For example, as shown in FIG. 1 and FIG. 3, the first angle portion 1011 includes a vertex P, which can be located on the connecting line 303. The parts extending from two sides connected with both ends of the first angle portion 1011 to the vertex P of the first angle portion 1011 meet to form a curve line (i.e., the outer edge of the first angle portion 1011), so that the first angle portion 1011 is a rounded angle. In this case, the first angle portion 101 can include the range of x microns along the contour from the vertex P, and the value of x can be in the range of 2-7 microns. In the case where the first angle portion is a rounded angle and the vertex angle opposite to the first angle portion in the shape of the light emitting region is a right angle or an acute angle, the distance between the intersection of the extension lines of the two straight sides connected with both ends of the first angle portion and the geometric center O of the light emitting region 101 is greater than the distance between the intersection of the extension lines of the two straight sides forming the vertex angle opposite to the first angle portion and the geometric center O.

The above-mentioned "rounded angle" refers to a vertex angle formed by a section of curve, which can be an arc or an irregular curve, such as a curve cut from an ellipse, a wavy line, etc. The embodiments of the present disclosure illustratively show that the curve has a convex shape with respect to the geometric center O of the light emitting region 101, but it is not limited thereto, and it can also have a concave shape with respect to the geometric center O of the light emitting region 101. For example, in the case where the curve is a convex arc, the central angle of the arc can be in the range of 10 degrees to 150 degrees. For example, the central angle of the arc can be in the range of 60 degrees to 120 degrees. For example, the value of the central angle of the arc can be 90 degrees. For example, the curve length of the rounded angle included in the first angle portion 111 can be in the range of 10-60 microns.

For example, in the case where the first angle portion 1011 is a rounded angle, the radius of curvature can be in the range of 5-20 microns.

Figure 4A:
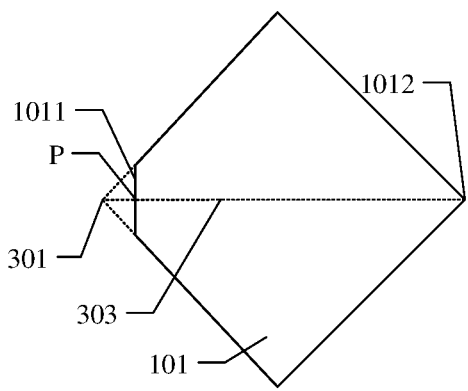
FIG. 4A is a schematic diagram of another shape of one light emitting region.

For example, FIG. 4A is a schematic diagram of another shape of one light emitting region. As shown in FIG. 4A, the first angle portion can also be a line segment (i.e., the outer edge of the first angle portion) formed by the parts where two edges of a certain vertex angle extend to its vertex P and intersect, so that the vertex angle becomes a flat angle. For example, the first angle portion 1011 includes a flat angle, and the vertex of the first angle portion can be located on the connecting line 303, and for example, can be the intersection of the connecting line 303 and the flat angle.

Figure 4B:
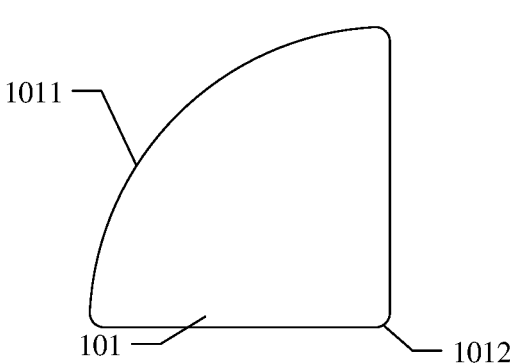
FIG. 4B is a schematic diagram of another shape of one light emitting region.

For example, FIG. 4B is a schematic diagram of another shape of one light emitting region. As shown in FIG. 4B, the shape of the light emitting region 101 having the first angle portion 1011 can be a sector, and its outline includes two straight sides, an arc connecting the two straight sides of the first angle portion 1011, and a vertex of the second angle portion 1012 formed by the intersection of the two straight sides (or an arc connecting the two straight sides of the second angle portion 1012).

For example, as shown in FIGS. 1-4A, the shape of the outer edge of the first angle portion 1011 includes a line segment, and the ratio of the lengths of the outer edges of the first angle portions 1011 in different color sub-pixels 100 is in the range of 0.8-1.2. For example, the ratio of the lengths of the outer edges of the first angle portions 1011 in at least two color sub-pixels 100 is in the range of 0.9-1.1. For example, the lengths of the outer edges of the first angle portions 1011 in at least two color sub-pixels 100 are approximately equal. For example, in at least two color sub-pixels 100, the angle between the first angle portion 1011 and the connecting line 303 is the same.

For example, as shown in FIGS. 1-4A, the shape of the outer edge of the first angle portion 1011 includes an arc, and the ratio of the radians of the outer edges of the first angle portions 1011 in different color sub-pixels 100 is in the range of 0.8-1.2. For example, the ratio of the radians of the outer edges of the first angle portions 1011 in at least two color sub-pixels 100 is in the range of 0.9-1.1. For example, the radians of the outer edges of the first angle portions 1011 in at least two color sub-pixels are approximately equal.

For example, in at least one color sub-pixel 100, the lengths of two sides, connecting both ends of the first angle portion 1011, of the light emitting region 101 are approximately equal.

For example, as shown in FIG. 1, the light emitting regions 101 of the first color sub-pixel 110, the second color sub-pixel 120 and the third color sub-pixel 130 all include the first angle portion 1011, and the counts of first angle portions 1011 in different color sub-pixels 100 are different.

The embodiments of the present disclosure are illustrated by taking that the shape (including parameters such as length and curvature, etc.) and count of the first angle portions in the same color sub-pixel are the same and the shapes of the first angle portions in different color sub-pixels are the same as an example, but not limited thereto, and the shapes of the first angle portions in different color sub-pixels can be the same or different.

For example, as shown in FIG. 1, the first color sub-pixel 110 includes four first angle portions 1011, the second color sub-pixel 120 includes two first angle portions 1011, and the third color sub-pixel 130 includes one first angle portion 1011.

For example, as shown in FIGS. 1-4A, in at least one of the first color sub-pixel 110, the second color sub-pixel 120, and the third color sub-pixel 130, the vertex angle of the light emitting region 101 further includes a second angle portion 1012, and the distance between the intersection (i.e., the vertex of the first angle portion 301) of two sides connecting with both ends of the first angle portion 1011 or extension lines thereof and the geometric center O of the light emitting region 101 of the sub-pixel 100 is greater than the distance between the intersection of two sides forming the second angle portion 1012 or extension lines thereof and the geometric center O. The "two sides forming the second angle portion 1012" can mean that the two sides are intersected to form the second angle portion, or the two sides are connected with both ends of the second angle portion.

For example, as shown in FIGS. 1-4A, the second angle portion 1012 can be an angle portion of the polygon 300 with the vertex angle not cut off, that is, the second angle portion 1012 can be a vertex angle of the polygon 300, which can be opposite to the first angle portion 1011 or adjacent to the first angle portion 1011.

For example, as shown in FIGS. 1-4A, the second angle portion 1012 can be an angle portion of the polygon 300 with a second vertex angle 304 formed by two second sides 320 cut off or with a second vertex angle 304 formed by one first side 310 and one second side 320 cut off, and the ratio of the length of the cut-off part L3 of at least one side of the first side 310 and the second side 320 to the length of the at least one side is in the range of 0.05-0.2. The second side 320 of the polygon 300 forms, by cutting a second line segment L3 off, a side (i.e. a retained part L4) connecting the light emitting region 101 of the second angle portion 1012, and the ratio of the length of the second line segment L3 to the length of the side is in the range of 0.05-0.2. For example, the ratio of the length of the second line segment L3 to the length of the side is in the range of 0.08-0.18. For example, the ratio of the length of the second line segment L3 to the length of the side is in the range of 0.1-0.15.

For example, the ratio of the length of the second line segment L3 to the length of the retained part L4 is in the range of 0.05-0.3. For example, the ratio of the length of the second line segment L3 to the length of the retained part L4 is in the range of 0.1-0.2.

For example, as shown in FIGS. 1-4A, the lengths of the first side 310 and the second side 320 can be the same, and the length of the first line segment L1 is greater than the length of the second line segment L3, so the curvature (or arc radian or length) of the first angle portion 1011 is greater than the curvature (or arc radian or length) of the second angle portion 1012.

For example, as shown in FIGS. 1-4A, the shape of the outer edge of the second angle portion 1012 includes a line segment, and the ratio of the lengths of the outer edges of the second angle portions 1012 in different color sub-pixels 100 is in the range of 0.8-1.2. For example, the ratio of the lengths of the outer edges of the second angle portions 1012 in at least two color sub-pixels 100 is in the range of 0.9-1.1. For example, the lengths of the outer edges of the second angle portions 1012 in at least two color sub-pixels 100 are approximately equal. For example, in at least two color sub-pixels 100, the angle between the second angle portion 1012 and the connecting line connecting the second angle portion 1012 and the vertex of the vertex angle opposite to the second angle portion 1012 is the same.

For example, as shown in FIGS. 1-4A, the shape of the outer edge of the second angle portion 1012 includes an arc, and the ratio of radians of the outer edge of the second angle portions 1012 in different color sub-pixels 100 is in the range of 0.8-1.2. For example, the ratio of radians of the outer edges of the second angle portions 1012 in at least two color sub-pixels 100 is in the range of 0.9-1.1. For example, the radians of the outer edges of the second angle portions 1012 in at least two color sub-pixels 100 are approximately equal.

For example, in at least one color sub-pixel 100, the lengths of two sides, connecting both ends of the same second angle portion 101, of the light emitting region 101 are approximately equal.

The embodiments of the present disclosure are illustrated by taking that the shapes (including parameters such as length and curvature, etc.) and counts of the second angle portions in the same color sub-pixel are the same and the shapes of the second angle portions in different color sub-pixels are the same as an example, but not limited thereto, and the second angle portions in different color sub-pixels can have the same shapes or different shapes.

For example, as shown in FIGS. 1-4A, among the angle portions of at least part of the light emitting regions 101, angle portions other than the first angle portion 1011 are the second angle portion 1012, and the plurality of angle portions in at least part of the light emitting regions 101 only include the first angle portion 1011 and the second angle portion 1012.

For example, as shown in FIGS. 1-4A, in at least one of the first color sub-pixel 110, the second color sub-pixel 120 and the third color sub-pixel 130, the connecting lines between intersections of the extension lines of the sides of the light emitting region 101 form a rhombus, and a diagonal of the rhombus is parallel to at least one of the row direction and the column direction. The connecting lines between intersections of the extension lines of the sides of the light emitting region 101 form the polygon.

For example, as shown in FIGS. 1-4A, in one color sub-pixel of the first color sub-pixel 110, the second color sub-pixel 120, and the third color sub-pixel 130, the connecting lines between intersections of the extension lines of the sides of the light emitting region 101 form a long strip, such as a rectangle, and the long axis of the long strip is intersected with both the row direction and the column direction.

For example, the angle between the long axis of the long strip and the row direction can be in the range of 20-60 degrees. For example, the angle between the long axis of the long strip and the row direction can be in the range of 30-50 degrees.

For example, FIG. 1 illustratively shows that each light emitting region 101 includes four angle portions, the shape of the polygon corresponding to each of the first color sub-pixel 110 and the third color sub-pixel 130 is a rhombus or square, and the shape of the polygon corresponding to the second color sub-pixel 120 is a rectangle. For example, the first color sub-pixel 110 includes four first angle portions 1011; the second color sub-pixel 120 includes two first angle portions 1011 and two second angle portions 1012, and in the second color sub-pixel 120, the arc radian of the first angle portion 1011 is greater than the arc radian of the second angle portion 1012; the third color sub-pixel 130 includes one first angle portion 1011 and three second angle portions 1012, and the arc radian of the first angle portion 1011 is greater than the arc radian of the second angle portion 1012; but the embodiments of the present disclosure are not limited thereto.

For example, as shown in FIG. 1, two first angle portions 1011 in the second color sub-pixel 120 are adjacent angle portions, and the side between two adjacent first angle portions 1011 is a short side of the light emitting region. The embodiments of the present disclosure are not limited thereto, and the side between two adjacent first angle portions can also be a long side of the light emitting region.

For example, two adjacent angle portions of the light emitting region 101 of at least one sub-pixel 100 are the first angle portions 1101, and the endpoints, close to each other, of the two adjacent first angle portions 1011 can be connected by a line segment, or the endpoints, close to each other, of the two adjacent first angle portions 1011 coincide with each other, that is, the distance between the two endpoints is 0, which is not limited by the embodiments of the present disclosure.

For example, two adjacent angle portions of the light emitting region 101 of at least one sub-pixel 100 are the second angle portions 1102, and the endpoints, close to each other, of the two adjacent second angle portions 1102 can be connected by a line segment.

For example, two adjacent angle portions of the light emitting region 101 of at least one sub-pixel 100 include the first angle portion 1011 and the second angle portion 1012, and the first angle portion 1011 and second angle portion 1012 adjacent to each other can be connected by a line segment, or the endpoints, close to each other, of the first angle portion 1011 and the second angle portion 1012 adjacent to each other, coincide with each other, that is, the distance between the two endpoints is zero, which is not limited by the embodiments of the present disclosure.

For example, at least part of the light emitting regions 101 include four angle portions; four angle portions of one color sub-pixel of the first color sub-pixel 110, the second color sub-pixel 120 and the third color sub-pixel 130 include two, three or four first angle portions 1101, and four angle portions of at least one of the remaining two color sub-pixels of the first color sub-pixel 110, the second color sub-pixel 120 and the third color sub-pixel 130 include one first angle portion.

For example, as shown in FIG. 1, the third color sub-pixel 130 includes one first angle portion 1101, and both the second color sub-pixel 120 and the first color sub-pixel 110 include at least two first angle portions 1101. Of course, the color of the sub-pixel including one first angle portion is not limited in the embodiments of the present disclosure, and the sub-pixel can be a red sub-pixel, a green sub-pixel or a blue sub-pixel; the color of the sub-pixel including at least two first angle portions is not limited in the embodiments of the present disclosure, and the sub-pixel can be a red sub-pixel, a green sub-pixel or a blue sub-pixel.

For example, the four angle portions of one color sub-pixel of the first color sub-pixel 110, the second color sub-pixel 120 and the third color sub-pixel 130 are all first angle portions 1101; the four angle portions of another color sub-pixel of the first color sub-pixel 110, the second color sub-pixel 120 and the third color sub-pixel 130 include two first angle portions 1101; and the four angle portions of the remaining one color sub-pixel of the first color sub-pixel, the second color sub-pixel and the third color sub-pixel include one first angle portion.

For example, as shown in FIG. 1, the four angle portions of the first color sub-pixel 110 are all first angle portions 1101, the four angle portions of the second color sub-pixel 120 include two first angle portions 1101, and the four angle portions of the third color sub-pixel 130 include one first angle portion 1101. Of course, the color of the sub-pixel including one first angle portion is not limited in the embodiments of the present disclosure, and the sub-pixel can be a red sub-pixel, a green sub-pixel or a blue sub-pixel; the color of the sub-pixel including two first angle portions is not limited in the embodiments of the present disclosure, and the sub-pixel can be a red sub-pixel, a green sub-pixel or a blue sub-pixel; the color of the sub-pixel including four first angle portions is not limited in the embodiments of the present disclosure, and the sub-pixel can be a red sub-pixel, a green sub-pixel or a blue sub-pixel.

For example, the four angle portions of two color sub-pixels of the first color sub-pixel 110, the second color sub-pixel 120 and the third color sub-pixel 130 include one first angle portion 1101, and the four angle portions of the remaining one color sub-pixel of the first color sub-pixel 110, the second color sub-pixel 120 and the third color sub-pixel 130 include three first angle portions 1101.

For example, as shown in FIG. 1, one sub-pixel 100 includes the first angle portion 1011, another color sub-pixel 100 adjacent to the one sub-pixel 100 in at least one of the row direction and the column direction does not include the first angle portion 1011, or the angle portion angles included in the light emitting region 101 of the another color sub-pixel 100 are all first angle portions 1011, and the connecting line CL between the geometric centers of the one sub-pixel and the another color sub-pixel adjacent to the sub-pixel is not parallel to the row direction or the column direction.

For example, the connecting line CL between the geometric centers has an included angle less than 45 degrees with one of the row direction and the column direction. For example, the connecting line CL between the geometric centers has an included angle less than 30 degrees with one of the row direction and the column direction. For example, the connecting line CL between the geometric centers has an included angle less than 20 degrees with one of the row direction and the column direction. For example, the connecting line CL between the geometric centers has an included angle less than 15 degrees with one of the row direction and the column direction. For example, the connecting line CL between the geometric centers has an included angle less than 10 degrees with one of the row direction and the column direction. For example, the connecting line CL between the geometric centers has an included angle less than 5 degrees with one of the row direction and the column direction.

For example, at least part of the sub-pixels further include a pixel circuit (the pixel circuit 700 shown in FIG. 7A and FIG. 7B), and the pixel circuit is configured to be connected with a light emitting element to drive the light emitting element to emit light. Some sub-pixels are arranged in at least partial regions on the display substrate, and the pixel circuits of these sub-pixels are arrayed along the row direction and the column direction. The sub-pixels driven by the pixel circuits in the same row are sub-pixels located in the same row (including the first color sub-pixels and the third color sub-pixels located in the same row, or the second color sub-pixels located in the same row), and the sub-pixels driven by the pixel circuits in the same column are sub-pixels located in the same column.

For example, the display substrate further includes a plurality of gate lines extending in the row direction and arranged in the column direction, and the sub-pixels controlled by the same gate line are sub-pixels located in the same row.

For example, the light emitting regions of the first color sub-pixels and the third color sub-pixels arranged in the row direction can be crossed by a straight line extending in the row direction, and the straight line can pass through the geometric centers of the light emitting regions of at least part of the sub-pixels. For example, the light emitting regions of the second color sub-pixels arranged in the row direction can also be crossed by a straight line extending in the row direction, and the straight line can pass through the light emitting regions of at least part of the sub-pixels. Similarly, the light emitting regions of one column of sub-pixels arranged in the column direction can be crossed by a straight line extending in the column direction, and the straight line can pass through the geometric centers of the light emitting regions of at least part of the sub-pixels.

For example, as shown in FIG. 1, the "one sub-pixel" described above can be the third color sub-pixel 130, and the "another color sub-pixel" can be the first color sub-pixel 110. The third color sub-pixel 130 includes one first angle portion 1011, and the angle portions of the light emitting region 101 of the first color sub-pixel 110 are all the first angle portions 1011. The third color sub-pixel 130 is provided with one first angle portion 1011, the geometric center of the light emitting region of the sub-pixel is shifted to the direction away from the first angle portion 1011 compared with the case without the first angle portion 1011; however, the angle portions of the first color sub-pixel 110 are all the first angle portions 1011, and the geometric center of the light emitting region of the sub-pixel is not shifted compared with the case without the first angle portions 1011; therefore, the connecting line between the geometric centers of the two color sub-pixels arranged along one of the row direction and the column direction is no longer a straight line, but a polyline. Of course, the embodiments of the present disclosure are not limited to the case in which the "one sub-pixel" is the third color sub-pixel, and it can also be that the "one sub-pixel" is the first color sub-pixel, and accordingly, the "another color sub-pixel" is the third color sub-pixel.

For example, as shown in FIG. 1, the number of first angle portions included in the "one sub-pixel" described above can be multiple, but they cannot all be located at opposite vertex angles. That is, the geometric center of the light emitting region of the "one sub-pixel" including the first angle portion is shifted compared with the case that the sub-pixel is not provided with the first angle portion, and for example, the geometric center is shifted to a direction away from the first angle portion.

Figure 4C:
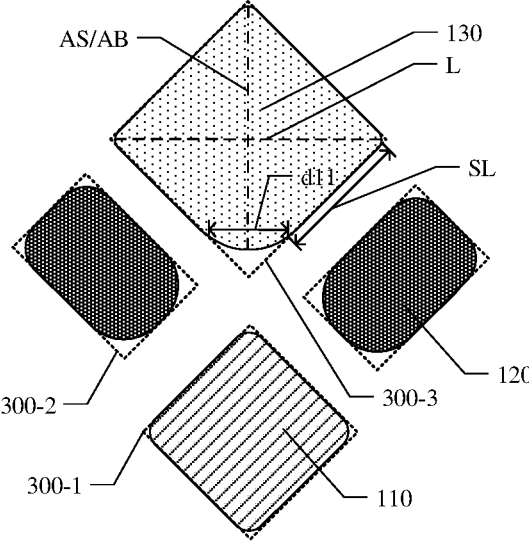
FIG. 4C is a schematic diagram of light emitting regions of some sub-pixels shown in FIG. 1.

For example, FIG. 4C is a schematic diagram of the light emitting regions of some sub-pixels shown in FIG. 1. As shown in FIG. 4C, the sides of the light emitting region of the first color sub-pixel 110 or the extension lines of the sides of the light emitting region of the first color sub-pixel 110 are sequentially connected to form a first polygon 300-1, the sides of the light emitting region of the second color sub-pixel 120 or the extension lines of the sides of the light emitting region of the second color sub-pixel 120 are sequentially connected to form a second polygon 300-2, and the sides of the light emitting region of the third color sub-pixel 130 or the extension lines of the sides of the light emitting region of the third color sub-pixel 130 are sequentially connected to form a third polygon 300-3, and at least two of the first polygon 300-1, the second polygon 300-2 and the third polygon 300-3 are similar patterns. For example, the first polygon 300-1 and the third polygon 300-3 are similar patterns. The embodiments of the present disclosure are not limited thereto, and it can be that the first polygon and the second polygon are similar patterns; or the second polygon and the third polygon are similar patterns; or all of these three polygons are similar patterns.

For example, as shown in FIG. 1 and FIG. 4C, in the same sub-pixel 100, the shortest distance d11 of two straight sides SL connecting to two ends of the first angle portion 1011 is not greater than the length of the connecting line L between vertices of two angle portions both adjacent to the first angle portion 1011 in the sub-pixel 100.

For example, as shown in FIG. 1 and FIG. 4C, the lengths of the two straight sides SL connecting to the two ends of the first angle portion 1011 are not less than 3 microns. For example, the lengths of the two straight sides SL connecting to the two ends of the first angle portion 1011 are not less than 4 microns. The lengths of the two straight sides SL connecting to the two ends of the first angle portion 1011 are not less than 5 microns.

For example, as shown in FIG. 1 and FIG. 4C, the light emitting region 101 of at least one sub-pixel 100 with the first angle portion 1011 is an axisymmetric pattern, and at least one axis of symmetry AS in the axisymmetric pattern coincides with the bisector AB of the first angle portion 1011.

Figures 5, 6A:
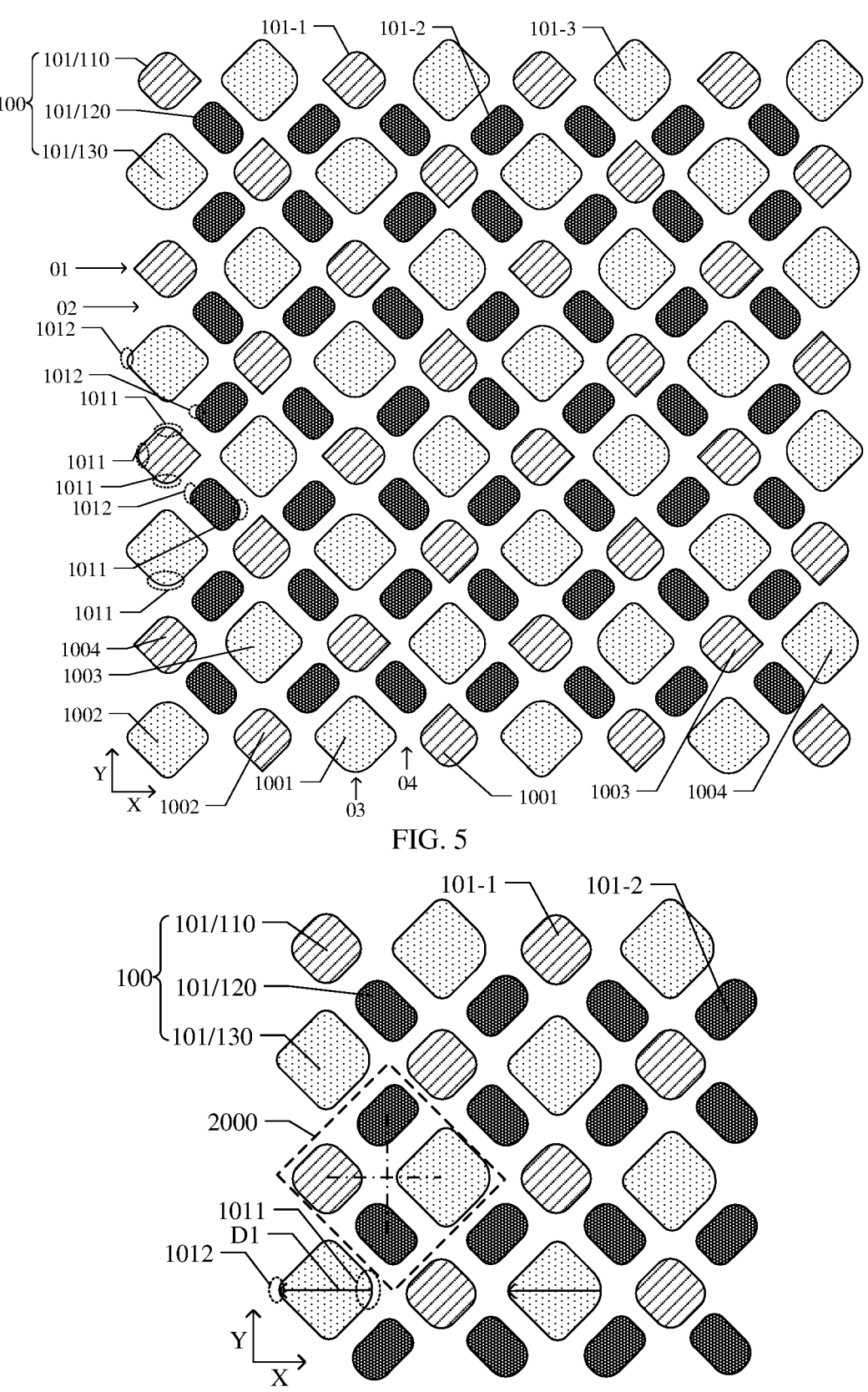
FIG. 5 is a partial planar view of pixel arrangement in a display substrate provided by another example of an embodiment of the present disclosure.
FIG. 6A is a partial planar view of pixel arrangement in a display substrate provided by an example of an embodiment of the present disclosure.

FIG. 5 is a partial planar view of pixel arrangement in a display substrate provided by another example of an embodiment of the present disclosure. As shown in FIG. 5, each of the third color sub-pixel 130 and the second color sub-pixel 120 includes one first angle portion 1101, and the first color sub-pixel 110 includes three first angle portions 1101. Of course, the color of the sub-pixel including one first angle portion is not limited in the embodiments of the present disclosure, and the sub-pixel including one first angle portion can be a red sub-pixel, a green sub-pixel or a blue sub-pixel; the color of the sub-pixel including three first angle portions is not limited in the embodiments of the present disclosure, and the sub-pixel including three first angle portions can be a red sub-pixel, a green sub-pixel or a blue sub-pixel.

For example, as shown in FIG. 5, the second angle portion 1012 of each sub-pixel 100 can be a vertex angle formed by the intersection of two adjacent straight edges, or can be a rounded angle or a flat angle, without being limited by the embodiments of the present disclosure. For example, as shown in FIG. 5, the shapes of the second angle portions 1012 in different color sub-pixels can be the same or different.

In the case where the number of angle portions of each light emitting region is four, the counts of first angle portions included in different color sub-pixels are not limited in the embodiments of the present disclosure. It can be that the counts of first angle portions included in three color sub-pixels are different, and the counts can be three numbers selected from one to four; it can also be that the counts of first angle portions included in two color sub-pixels are the same, and the count of first angle portions included in the remaining color sub-pixel is different, and therefore, the counts of first angle portions included in the two color sub-pixels can be one number selected from one to four, and the count of first angle portions included in the remaining color sub-pixel can be another number selected from one to four; it can also be that only two color sub-pixels include the first angle portions, and the counts of first angle portions included by different color sub-pixels can be two numbers selected from one to four. The embodiments of the present disclosure can be set according to the needs of products.

Of course, the embodiments of the present disclosure are not limited to the case in which the number of angle portions of each light emitting region is four, and the number of angle portions of each light emitting region can be three or more than four. In these cases, the counts of first angle portions in sub-pixels can be set according to the above-mentioned rule.

For example, in at least one color sub-pixel of the first color sub-pixel 110, the second color sub-pixel 120 and the third color sub-pixel 130, each light emitting region 101 includes the first angle portion 1011 and the second angle portion 1012, and the second angle portion 1012 includes an angle portion opposite to the first angle portion 1011. The at least one color sub-pixel includes sub-pixels of the same type, and in the sub-pixels of the same type, a direction in which a vertex of the first angle portion 1011 points to a vertex of the second angle portion 1012 opposite to first angle portion is the same.

For example, FIG. 6A is a partial planar view of pixel arrangement in a display substrate provided by an example of an embodiment of the present disclosure. As shown in FIG. 6A, the third color sub-pixel 130 includes sub-pixels of the same type, and in the sub-pixels of the same type, the direction D1 in which the vertex of the first angle portion 1011 points to the vertex of the second angle portion 1012 opposite to first angle portion 1011 is reverse to the direction indicated by the arrow in the X direction; for example, the direction D1 points to the left and the first angle portion 1011 faces to the right. For example, one column of first color sub-pixels 110 and one column of second color sub-pixels 120, in the first pixel column and the second pixel column which are arranged in the Y direction and adjacent to each other, are easy to form a wavy line when emitting light. By setting the third color sub-pixels 130 with the first angle portion 1011 thereof facing to the right, the brightness center can be adjusted, the jagged phenomenon can be reduced, and the display effect of the display substrate can be improved.

The embodiments of the present disclosure are not limited thereto. In the sub-pixels of the same type, the direction in which the vertex of the first angle portion points to the vertex of the second angle portion opposite to the first angle portion can be the same as direction indicated by the arrow in the X direction, and for example, the direction D1 points to the right, and the first angle portion faces to the left; or, in the sub-pixels of the same type, the direction in which the vertex of the first angle portion points to the vertex of the second angle portion opposite to the first angle portion can also be the same as the direction indicated by the arrow in the Y direction, and for example, the direction D1 points to the upward and the first angle portion faces to the downward; or, in the sub-pixels of the same type, the direction in which the vertex of the first angle portion points to the vertex of the second angle portion opposite to the first angle portion can also be reverse to the direction indicated by the arrow in the Y direction, and for example, the direction D1 points to the downward and the first angle portion faces to the upward. For example, one row of first color sub-pixels 110 and one row of second color sub-pixels 120, in the first pixel row and the second pixel row which are arranged in the X direction and are adjacent to each other, are easy to form a wavy line when emitting light. By making the first angle portion 1011 of the third color sub-pixel 130 face to the upward or downward, the brightness center can be adjusted, the jagged phenomenon can be reduced, and the display effect of the display substrate can be improved.

For example, as shown in FIG. 6A, in sub-pixels of this type in the third color sub-pixel 130, the direction in which the vertex of the first angle portion 1011 points to the vertex of the second angle portion 1012 opposite to the first angle portion 1011 can be parallel to the row direction or the column direction.

The embodiments of the present disclosure are not limited to the case in which the orientations of the first angle portions of the third color sub-pixels in each row or each column are the same. For example, in at least one of the plurality of first pixel rows, the orientations of the first angle portions 1011 of the third color sub-pixels 130 are the same; or, in at least one of the first pixel columns, the orientations of the first angle portions 1011 of the third color sub-pixels 130 are the same. For example, the orientations of the first angle portions 1011 of the third color sub-pixels 130 located in different first pixel rows (or different first pixel columns) can be the same or different, and can be set according to actual product requirements.

The embodiments of the present disclosure are not limited to the case in which the first angle portions of the third color sub-pixels all face to the same direction. For example, it can be that the first angle portions of the second color sub-pixels all face to the same direction, or the first angle portions of the first color sub-pixels all face to the same direction, or the first angle portions of at least two color sub-pixels all face to the same direction.

For example, as shown in FIG. 6A, the display substrate includes a plurality of sub-pixel groups 2000, at least one sub-pixel group 2000 includes one first color sub-pixel 110 and one third color sub-pixel 130 arranged adjacent to each other along one of the row direction and the column direction, and two second color sub-pixels 120 arranged adjacent to each other along the other of the row direction and the column direction; the connecting line between the centers of the two second color sub-pixels 120 is intersected with the connecting line between the centers of the other two sub-pixels, and the two second color sub-pixels 120 are symmetrically distributed relative to the connecting line between the centers of the other two sub-pixels. For example, the second color sub-pixel 120 is a green sub-pixel, and two second color sub-pixels 120 in the sub-pixel group 2000 are symmetrically distributed, which is helpful to improve the uniformity of the distribution of green sub-pixels on the display substrate.

For example, as shown in FIG. 6A, in at least one second sub-pixel group 2000, the four angle portions of the third color sub-pixel 130 include at least one first angle portion 1011, and the at least one first angle portion 1011 includes the angle portion of the third color sub-pixel 130 farthest from the first color sub-pixel 110, which is helpful to adjust the center of the third color sub-pixel 130 close to the first color sub-pixel 110 and improve the brightness uniformity of the display substrate.

For example, FIG. 6A illustratively shows that in each sub-pixel group 2000, the third color sub-pixel 130 includes one first angle portion 1011, and the first angle portion 1011 is an angle portion of the third color sub-pixel 130 farthest from the first color sub-pixel 110 adjacent to the third color sub-pixel 130 in the row direction, that is, the first angle portion 1011 faces to the right or left.

The embodiments of the present disclosure are not limited thereto. For example, the first angle portions of the third color sub-pixels can all face to the upward or all face to the downward, so that the first angle portion of the third color sub-pixel is located away from the first color sub-pixel adjacent to the third color sub-pixels in the column direction, so as to adjust the brightness center.

For example, in at least one sub-pixel group 2000, in the case where the third color sub-pixel 130 includes a plurality of first angle portions 1011, the first angle portions 1011 can be any angle portions other than the angle portion closest to the first color sub-pixel 110.

Figure 6B:
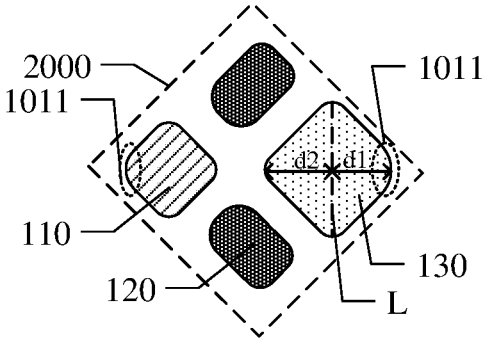
FIG. 6B is a schematic diagram of one sub-pixel group provided by an embodiment of the present disclosure.

For example, FIG. 6B is a schematic diagram of one sub-pixel group provided by an embodiment of the present disclosure. As shown in FIG. 6B, in at least one sub-pixel group 2000, the first color sub-pixel 110 can also include at least one first angle portion 1011, and the at least one first angle portion 1011 can include the angle portion farthest from the third color sub-pixel 130, which is helpful to adjust the brightness center.

For example, as shown in FIG. 6B, in at least one sub-pixel group 2000, the second color sub-pixel 120 can include at least one first angle portion 1011, and the position and number of first angle portions 1011 can be set according to the brightness requirements of the display substrate. For example, the first angle portion 1011 of the second color sub-pixel 120 can be set on one side facing the first color sub-pixel 110, or can be set on one side facing the third color sub-pixel 130, or can be set on one side away from the first color sub-pixel 110 and away from the third color sub-pixel 130. For example, the second color sub-pixel 120 can be provided with two first angle portions 1011, and the two first angle portions 1011 are two adjacent angle portions of the light emitting region. For example, the second color sub-pixel 120 can also be provided with three first angle portions 1011 or four first angle portions 1011.

For example, at least one color sub-pixel of the first color sub-pixel 110, the second color sub-pixel 120 and the third color sub-pixel 130 includes at least two types of sub-pixels, and in different types of sub-pixels, the directions in which the vertex of the first angle portion 1011 points to the vertex of the second angle portion 1012 opposite to the first angle portion 1011 are different.

Different types of sub-pixels in the embodiments of the present disclosure refer to sub-pixels with different directions in which the vertex of the first angle portion points to the vertex of the second angle portion opposite to the first angle portion. For example, the sub-pixel can include one first angle portion and three second angle portions, and one of the three second angle portions is opposite to the first angle portion. The sub-pixel can also include two first angle portions and two second angle portions, and each first angle portion is opposite to a corresponding second angle portion; in this case, the two first angle portions are adjacent angle portions, and according to the relative position relationship of the two first angle portions, one of the first angle portions is used as a reference first angle portion for judging different types of sub-pixels, and the direction in which the reference first angle portion points to the second angle portion opposite to the reference first angle portion is used as a reference direction. The sub-pixel can also include three first angle portions and one second angle portion; the first angle portion opposite to the second angle portion is used as the reference first angle portion for judging different types of sub-pixels, and the direction in which the reference first angle portion points to the second angle portion opposite to the reference first angle portion is used as a reference direction.

For example, as shown in FIG. 6B, in the light emitting region of at least one color sub-pixel, the connecting line L between the vertices of the remaining two angle portions other than the reference first angle portion and the second angle portion opposite to the reference first angle portion divides the light emitting region into two parts, one part is the part where the first angle portion is located and the other part is the part where the second angle portion is located. For example, in the same sub-pixel, the connecting line L between the vertices of two angle portions both adjacent to the first angle portion 1011 divides the sub-pixel into two parts with different areas.

For example, the area ratio of the two parts is in the range of 0.1-10. For example, the area ratio of the two parts is in the range of 0.2-9. For example, the area ratio of the two parts is in the range of 0.3-8. For example, the area ratio of the two parts is in the range of 0.4-7. For example, the area ratio of the two parts is in the range of 0.5-6. For example, that area ratio of the two parts is in the range of 0.7-5.

For example, the ratio of the area of the part where the first angle portion 1011 is located to the area of the part where the second angle portion 1012 is located can be in the range of 0.1-0.99. For example, the ratio of the area of the part where the first angle portion 1011 is located to the area of the part where the second angle portion 1012 is located can be in the range of 0.2-0.9. For example, the ratio of the area of the part where the first angle portion 1011 is located to the area of the part where the second angle portion 1012 is located can be in the range of 0.3-0.8. For example, the ratio of the area of the part where the first angle portion 1011 is located to the area of the part where the second angle portion 1012 is located can be in the range of 0.4-0.7.

For example, as shown in FIG. 6B, the distance d1 between the vertex of the first angle portion 1011 and the connecting line L is less than the distance d2 between the vertex of the second angle portion 1012 and the connecting line L. For example, the ratio d1/d2 of the distance d1 between the vertex of the first angle portion 1011 and the connecting line L to the distance d2 between the vertex of the second angle portion 1012 and the connecting line L can be in the range of 0.1-0.9. For example, d1/d2 can be in the range of 0.2-0.8. For example, d1/d2 can be in the range of 0.4-0.6. For example, the ratio of d1 to d2 can be in the range of 0.7-0.9.

For example, as shown in FIG. 6B, the length of the connecting line between the vertex of the first angle portion 1011 and the vertex of the second angle portion 1012 can be a (i.e., the sum of the distance d1 and the distance d2), the length of the connecting line L can be b, and the ratio of a to b can be in the range of 0.6-0.9. For example, the ratio of a to b can be in the range of 0.7-0.8.

In a common display substrate, the shapes and areas of the two parts where the two opposite angle portions of each sub-pixel are located are the same. Compared with this display substrate, by reducing the area of the part where the first angle portion is located, the display substrate provided by the present disclosure can effectively improve the light transmittance of the display substrate in the case where the display substrate is applied to a display device with an under screen fingerprint function or an under screen camera function.

Figure 7A:
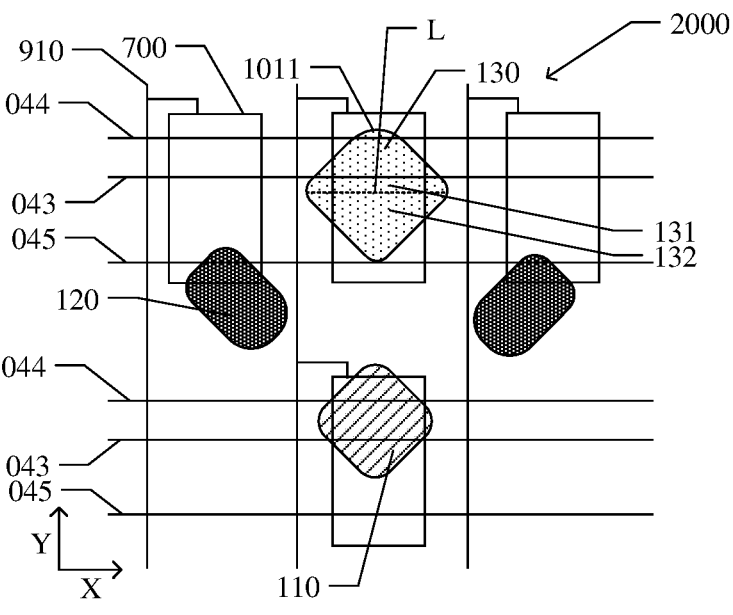
FIG. 7A is an arrangement diagram of another sub-pixel group 2000.

For example, FIG. 7A is an arrangement diagram of another sub-pixel group 2000. As shown in FIG. 7A, the third color sub-pixel 130 includes the first angle portion 1011, and a connecting line L between the vertices of two angle portions both adjacent to the first angle portion 1011 divides the third color sub-pixel 130 into a first part 131 and a second part 132. The first part 131 includes the first angle portion 1011, and the area of the first part 131 is less than the area of the second part 132.

For example, as shown in FIG. 7A, the luminous efficiency of the third color sub-pixel 130 is less than the luminous efficiency of the second color sub-pixel 120, and the second part 131 of the third color sub-pixel 130 is close to the second color sub-pixel 120 driven in the same row with the third color sub-pixel 130 and adjacent to the third color sub-pixel 130.

Figure 7B:
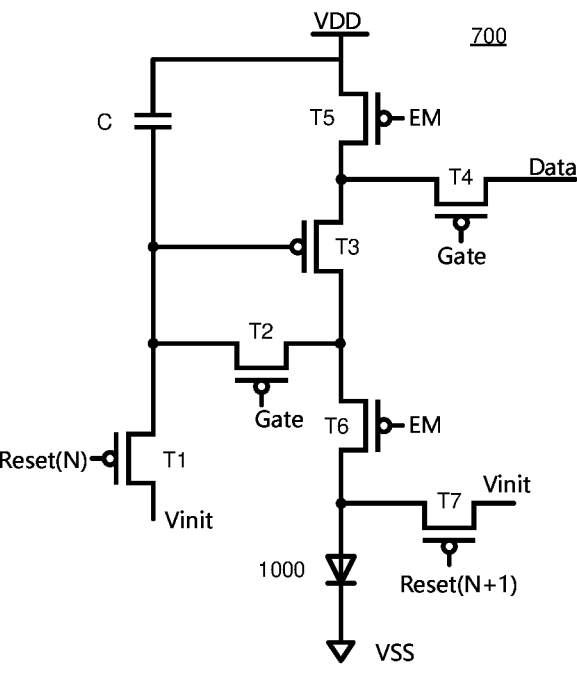
FIG. 7B is an equivalent circuit diagram of the pixel circuit shown in FIG. 7A.

For example, the sub-pixel in FIG. 7A includes a pixel circuit 700, and FIG. 7B is an equivalent circuit diagram of the pixel circuit shown in FIG. 7A. As shown in FIG. 7A and FIG. 7B, the pixel circuit 700 includes a second reset transistor T1, a second light emitting control transistor T5, a first light emitting control transistor T6, a data writing transistor T4, a driving transistor T3, a threshold compensation transistor T2, a first reset control transistor T7, and a storage capacitor C. For example, the display substrate further includes a scan signal line 043, a reset control signal line 044 and a light emitting control signal line 045, which extend in the row direction, and a data line 910 which extends in the column direction.

For example, the first electrode of the threshold compensation transistor T2 is connected to the first electrode of the driving transistor T3, and the second electrode of the threshold compensation transistor T2 is connected to the gate electrode of the driving transistor T3; the first electrode of the first reset control transistor T7 is connected to the reset power signal line to receive a reset signal Vinit, and the second electrode of the first reset control transistor T7 is connected to the second electrode of the light emitting element; the first electrode of the data writing transistor T4 is connected to the second electrode of the driving transistor T3, the second electrode of the data writing transistor T4 is connected to the data line to receive a data signal Data, and the gate electrode of the data writing transistor T4 is electrically connected to the scan signal line to receive a scan signal Gate; the first electrode of the storage capacitor C is electrically connected to the power signal line, and the second electrode of the storage capacitor C is electrically connected to the gate electrode of the driving transistor T3; the gate electrode of the threshold compensation transistor T2 is electrically connected to the scan signal line to receive a compensation control signal; the gate electrode of the first reset transistor T7 is electrically connected to a reset control signal line to receive a reset control signal Reset (N+1); the first electrode of the second reset transistor T1 is electrically connected to the reset power signal line to receive the reset signal Vinit, the second electrode of the second reset transistor T1 is electrically connected to the gate electrode of the driving transistor T3, and the gate electrode of the second reset transistor T1 is electrically connected to to reset control signal line to receive a reset control signal Reset (N); the gate electrode of the first light emitting control transistor T6 is electrically connected to the light emitting control signal line to receive a light emitting control signal EM; the first electrode of the second light emitting control transistor T5 is electrically connected to the power signal line to receive a first power signal VDD, the second electrode of the second light emitting control transistor T5 is electrically connected to the second electrode of the driving transistor T3, the gate electrode of the second light emitting control transistor T5 is electrically connected to the light emitting control signal line to receive the light emitting control signal EM, and the first electrode of the light emitting element is connected to a voltage terminal VSS. The power signal line refers to a signal line that outputs the voltage signal VDD, and can be connected with a voltage source to output a constant voltage signal, such as a positive voltage signal.

It should be noted that, in the embodiments of the present disclosure, in addition to the 7T1C (i.e., seven transistors and one capacitor) structure shown in FIG. 7B, the pixel circuit can be a structure including other numbers of transistors, such as a 7T2C structure, a 6T1C structure, a 6T2C structure or a 9T2C structure, without being limited in the embodiments of the present disclosure.

For example, as shown in FIG. 7A, in the sub-pixel group 2000, the pixel circuit 700 of one third color sub-pixel 130 and the pixel circuits 700 of two second color sub-pixels 120 are located in the same row, and for example, the above three pixel circuits 700 are controlled by the same scan signal line 043. For example, in the sub-pixel group 2000, the pixel circuit 700 of the first color sub-pixel 110 is located in a row different from the above three pixel circuits 700, that is, the pixel circuit 700 of the first color sub-pixel 110 and the pixel circuits 700 of the two second color sub-pixels 120 are controlled by two scan signal lines 043.

Figure 8:
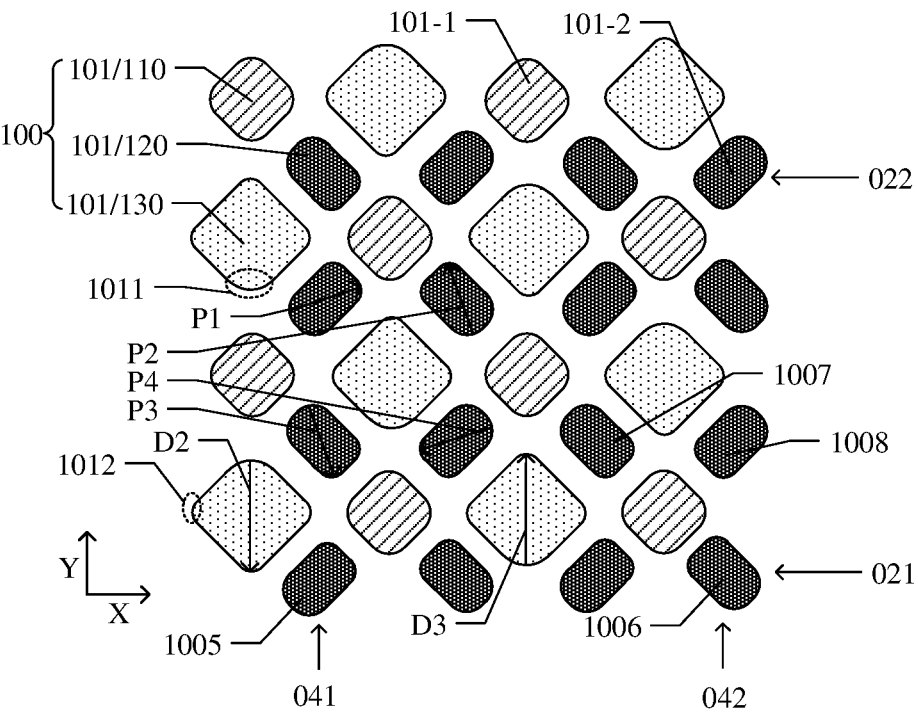
FIG. 8 is a partial planar view of pixel arrangement in a display substrate provided by an example of an embodiment of the present disclosure.

FIG. 8 is a partial planar view of pixel arrangement in a display substrate provided by an example of an embodiment of the present disclosure. As shown in FIG. 8, the at least one color sub-pixel includes two types of sub-pixels. In one type of sub-pixel, the direction in which the vertex of the first angle portion 1011 points to the vertex of the second angle portion 1012 opposite to the first angle portion 1011 is D2; in the other type of sub-pixels, the direction in which the vertex of the first angle portion 1011 points to the vertex of the second angle portion 1012 opposite to the first angle portion 1011 is D3; and the two directions are different.

For example, as shown in FIG. 8, the direction D2 and the direction D3 can be parallel and reverse to each other, but not limited thereto, and the two directions can also be intersected with each other.

For example, as shown in FIG. 8, the third color sub-pixels 130 include two different types of sub-pixels, the first angle portion 1011 of one type of sub-pixels faces to the upward, and the first angle portion 1011 of the other type of sub-pixels face to the downward.

The embodiments of the present disclosure are not limited thereto. For example, the orientations of the first angle portions of two different types of sub-pixels in the third color sub-pixel can also be left and right, or up and left, or up and right, or down and right, or down and left, respectively.

Of course, the embodiments of the present disclosure are not limited to the case in which the third color sub-pixel includes two different types. It can also be that at least one of the first color sub-pixel and the second color sub-pixel includes two different types of sub-pixels, and the judgment criteria of different types of sub-pixels in the same color sub-pixels can refer to the above judgment criteria of different types of sub-pixels in the third color sub-pixels.

For example, in the same color sub-pixels with different types of sub-pixels 100, two sub-pixels 100 adjacent to each other along at least one of the row direction and the column direction are different types of sub-pixels.

For example, as shown in FIG. 8, the orientations of the first angle portions 1011 in the two adjacent third color sub-pixels 130 arranged in the row direction are different. For example, they can be up and down, respectively, but not limited thereto, and they can also be left and right, or up and left, or up and right, or down and right, or down and left, respectively.

For example, as shown in FIG. 8, the orientations of the first angle portions 1011 in the two adjacent third color sub-pixels 130 arranged in the column direction are different. For example, they can be up and down, respectively, but not limited thereto, and they can also be left and right, or up and left, or up and right, or down and right, or down and left, respectively.

The embodiments of the present disclosure are not limited thereto, and the at least one color sub-pixel can also include three types of sub-pixels, the orientations of the first angle portions of the three different types of sub-pixels can include any three of up, down, left and right; the sub-pixels located in the same row (or same column) can include the same type of sub-pixels or at least two types of sub-pixels; and two sub-pixels adjacent in at least one of the row direction and the column direction can be the same type of sub-pixels or different types of sub-pixels, which can be set according to actual product requirements. For example, it can also be that one color sub-pixel includes the above three types of sub-pixels, or each color sub-pixel of two color sub-pixels includes the above three types of sub-pixels, or each color sub-pixel of three color sub-pixels includes the above three types of sub-pixels, which is not limited in the embodiments of the present disclosure.

For example, as shown in FIG. 1, the at least one color sub-pixel includes four different types of sub-pixels, such as a first type sub-pixel 1001, a second type sub-pixel 1002, a third type sub-pixel 1003 and a fourth type sub-pixel 1004. In different types of sub-pixels, the directions in which the vertex of the first angle portion 1011 points to the vertex of the second angle portion 1012 are different. For example, the positions of the first angle portion 1011 in different types of sub-pixels 100 are different. For example, the orientations of the first angle portion 1011 in different types of sub-pixels 100 are different.

For example, each type of sub-pixel 100 has the same shape or the same area. For example, each type of sub-pixel 100 has the same shape and the same area. For example, the number of different types of sub-pixels 100 is approximately the same. For example, among the first type sub-pixel 1001, the second type sub-pixel 1002, the third type sub-pixel 1003 and the fourth type sub-pixel 1004, the number ratio of any two types of sub-pixels is in the range of 0.8-1.2. For example, the number ratio of the first type sub-pixel 1001 to the second type sub-pixel 1002 is in the range of 0.8-1.2, and the number ratio of the third type sub-pixel 1003 to the fourth type sub-pixel 1004 is in the range of 0.8-1.2. For example, among the first type sub-pixel 1001, the second type sub-pixel 1002, the third type sub-pixel 1003 and the fourth type sub-pixel 1004, the number ratio of any two types of sub-pixels is in the range of 0.9-1.1.

For example, as shown in FIG. 1, among the first type sub-pixel 1001, the second type sub-pixel 1002, the third type sub-pixel 1003 and the fourth type sub-pixel 1004, the directions in which the vertex of the first angle portion 1011 points to the vertex of the second angle portion 1012 are a direction D2, a direction D3, a direction D4 and a direction D1, respectively. For example, in the light emitting region of the first type sub-pixel 1001, the direction in which the vertex of the first angle portion 1011 points to the vertex of the second angle portion 1012 is the direction D2; in the light emitting region of the second type sub-pixel 1002, the direction in which the vertex of the first angle portion 1011 points to the vertex of the second angle portion 1012 is the direction D3; in the light emitting region of the third type sub-pixel 1003, the direction in which the vertex of the first angle portion 1011 points to the vertex of the second angle portion 1012 is the direction D4; and in the light emitting region of the fourth type sub-pixel 1004, the direction in which the vertex of the first angle portion 1011 points to the vertex of the second angle portion 1012 is the direction D1.

For example, as shown in FIG. 1, in the first type sub-pixel 1001 and the second type sub-pixel 1002, the directions in which the vertex of the first angle portion 1011 points to the vertex of the second angle portion 1012 are reverse to each other, and for example, parallel to the column direction; in the third type sub-pixel 1003 and the fourth type sub-pixel 1004, the directions in which the vertex of the first angle portion 1011 points to the vertex of the second angle portion 1012, are reverse to each other, and for example, parallel to the row direction. Therefore, the direction D2 is reverse to the direction D3, and the direction D4 is reverse to the direction D1.

The embodiments of the present disclosure illustratively show that the third color sub-pixels include four different types of sub-pixels, but not limited thereto. It can also be that at least one color sub-pixels of the first color sub-pixels and the second color sub-pixels include the above four different types of sub-pixels, and the directions, in which the vertex of the first angle portion points to the vertex of the second angle portion, in different types of sub-pixels in the remaining color sub-pixel can be parallel to the row direction or the column direction, or intersected with the row direction or the column direction.

In the display substrate provided by the embodiments of the present disclosure, by setting four different types of sub-pixels, it is helpful to alleviate the problem of color shift upon the display substrate displaying. In addition, in a common display substrate, the shapes of the four angle portions included in the opening regions of the sub-pixels with different colors are all the same. Compared with this display substrate, the display substrate provided by the embodiments of the present disclosure, by arranging the four different types of sub-pixels, is favorable for reducing the graininess when the display substrate is displaying.

For example, as shown in FIG. 1, the plurality of first pixel rows 01 include first sub-pixel rows 011 and second sub-pixel rows 012 which are alternately arranged along the column direction. Sub-pixels of the same color in the first sub-pixel row 011 include the first type sub-pixel 1001 and the second type sub-pixel 1002 which are alternately arranged along the row direction, and sub-pixels of the same color in the second sub-pixel row 012 include the third type sub-pixel 1003 and the fourth type sub-pixel 1004 which are alternately arranged along the row direction. For example, sub-pixels of the same color in each first pixel row 01 include two types of sub-pixels, the orientations of the first angle portions 1011 in these two types of sub-pixels are opposite to each other, and the orientations of the first angle portions 1011 in adjacent first pixel rows 01 are intersected with each other.

For example, as shown in FIG. 1, the plurality of first pixel columns 03 include first sub-pixel columns 031 and second sub-pixel columns 032 which are alternately arranged along the row direction. Sub-pixels of the same color in the first sub-pixel column 031 include the first type sub-pixel 1001 and the second type sub-pixel 1002 which are alternately arranged along the column direction, and sub-pixels of the same color in the second sub-pixel column 032 include the third type sub-pixel 1003 and the fourth type sub-pixel 1004 which are alternately arranged along the column direction. For example, sub-pixels of the same color in each first pixel column 03 include two types of sub-pixels, the orientations of the first angle portions 1011 in these two types of sub-pixels are opposite to each other, and the orientations of the first angle portions 1011 in adjacent first pixel columns 03 are intersected with each other.

For example, as shown in FIG. 1 and FIG. 5, at least one color sub-pixels of the third color sub-pixels 130 and the first color sub-pixels 110 include the first type sub-pixel 1001, the second type sub-pixel 1002, the third type sub-pixel 1003 and the fourth type sub-pixel 1004.

For example, as shown in FIG. 5, both of the first color sub-pixels 110 and the third color sub-pixels 130 include the first type sub-pixel 1001, the second type sub-pixel 1002, the third type sub-pixel 1003 and the fourth type sub-pixel 1004.

For example, as shown in FIG. 5, the four angle portions of one color sub-pixel of the third color sub-pixel 130 and the first color sub-pixel 110 include one first angle portion 1011, and the four angle portions of the other color sub-pixel of the third color sub-pixel 130 and the first color sub-pixel 110 include at most three first angle portions 1011; or, the four angle portions of one color sub-pixel of the third color sub-pixel 130 and the first color sub-pixel 110 include two first angle portions 1011, and the four angle portions of the other color sub-pixel of the third color sub-pixel 130 and the first color sub-pixel 110 include two or three first angle portions 1011; or, both the third color sub-pixel 130 and the first color sub-pixel 110 include three first angle portions 1011.

For example, as shown in FIG. 5, the four angle portions of the third color sub-pixel 130 include one first angle portion 1011, and the four angle portions of at least part of the first color sub-pixels 110 include at least two first angle portions 1011. For example, the four angle portions of the first color sub-pixel 110 include two first angle portions 1011 or three first angle portions 1011.

In the case where both the first color sub-pixel and the third color sub-pixel include four different types of sub-pixels, the counts of first angle portions in the first color sub-pixel and the third color sub-pixel are not limited in the embodiments of the present disclosure, and the counts of first angle portions included in the first color sub-pixel and the third color sub-pixel can be the same or different. For example, in the case where the first color sub-pixel and the third color sub-pixel include the same number of first angle portions, the number of first angle portions included in the second color sub-pixel is different from the number of first angle portions included in the first color sub-pixel.

For example, the embodiments of the present disclosure are not limited to the case in which each first pixel row or each first pixel column includes only two types of sub-pixels, and at least one first pixel row or at least one first pixel column can also include three types of sub-pixels or four types of sub-pixels, which is helpful to alleviate the problem of color shift upon the display substrate displaying details such as a horizontal line or a vertical line, etc.

For example, as shown in FIG. 1, the first color sub-pixels 110 and the second color sub-pixels 120 are alternately arranged along a first oblique direction as a first group, the third color sub-pixels 130 and the second color sub-pixels 120 are alternately arranged along the first oblique direction as a second group, and the first group and the second group are alternately arranged along a second oblique direction. The first oblique direction and the second oblique direction are intersected with each other, and both of them are intersected with the row direction and the column direction. For example, at least one color sub-pixel arranged along the first oblique direction can include at least one type of sub-pixels, and at least one color sub-pixel arranged along the second oblique direction can include at least one type of sub-pixels. For example, sub-pixels of the same color arranged along at least one oblique direction described above can include four different types of sub-pixels, which is helpful to alleviate the problem of color shift when the display substrate displays details such as an oblique line, etc.

For example, as shown in FIGS. 1-8, the four angle portions of at least part of the second color sub-pixels 120 include at least one first angle portion 1011, and the second color sub-pixel 120 includes a fifth type sub-pixel 1005, a sixth type sub-pixel 1006, a seventh type sub-pixel 1007 and an eighth type sub-pixel 1008. In different types of sub-pixels, the directions in which the vertex of the first angle portion 1011 points to the vertex of the second angle portion 1012 opposite to the first angle portion 1011 are different. The selection of the reference first angle portion in the second color sub-pixel and the definition of different types of sub-pixels are the same as the above-mentioned selection methods and definitions of different types of sub-pixels, without being repeated here.

For example, as shown in FIGS. 1-8, in the fifth sub-pixel 1005, the sixth sub-pixel 1006, the seventh sub-pixel 1007 and the eighth sub-pixel 1008, the directions in which the vertex of the first angle portion 1011 points to the vertex of the second angle portion 1012 opposite to the first angle portion 1011 are respectively a first direction P1, a second direction P2, a third direction P3 and a fourth direction P4; and the first direction P1, the second direction P2, the third direction P3 and the fourth direction P4 are all intersected with the row direction and the column direction. For example, the first direction P1 is opposite to the fourth direction P4, and the second direction P2 is opposite to the third direction P3.

For example, as shown in FIG. 1 and FIG. 8, the plurality of second pixel rows 02 include third sub-pixel rows 021 and fourth sub-pixel rows 022 alternately arranged along the column direction, the third sub-pixel row 021 includes the fifth type sub-pixels 1005 and the sixth type sub-pixels 1006 alternately arranged along the row direction, and the fourth sub-pixel row 022 includes the seventh type sub-pixels 1007 and the eighth type sub-pixels 1008 alternately arranged along the row direction. For example, sub-pixels of the same color in each second pixel row 02 include two types of sub-pixels, the orientations of the first angle portion 1011 in these two types of sub-pixels are intersected with each other, and the orientations of two first angle portion 1011 respectively located in adjacent second pixel rows 02 can be opposite to or intersected with each other.

For example, as shown in FIG. 1 and FIG. 8, the plurality of second pixel columns 04 include third sub-pixel columns

041 and fourth sub-pixel columns 042 alternately arranged along the row direction, the third sub-pixel column 041 includes the fifth type sub-pixels 1005 and the seventh type sub-pixels 1007 alternately arranged along the column direction, and the fourth sub-pixel column 042 includes the sixth type sub-pixels 1006 and the eighth type sub-pixels 1008 alternately arranged along the column direction. For example, sub-pixels of the same color in each second pixel column 04 include two types of sub-pixels, the orientations of the first angle portion 1011 in these two types of sub-pixels are intersected with each other, and the orientations of two first angle portion 1011 respectively located in adjacent second pixel columns 04 can be opposite to or intersected with each other.

For example, as shown in FIG. 1, the display substrate includes a plurality of sub-pixel groups 1000, the plurality of sub-pixel groups 1000 are arranged as a plurality of first sub-pixel group rows 1-1 along the row direction, and adjacent first sub-pixel group rows 1-1 arranged along the column direction are shifted from each other along the row direction. For example, adjacent first sub-pixel group rows 1-1 arranged along the column direction are shifted from each other by a pitch of one sub-pixel group 1000 in the row direction.

For example, as shown in FIG. 1, at least part of the sub-pixel groups 1000 are surrounded by a circle of first color sub-pixels 110 and second color sub-pixels 120 which are alternately arranged. For example, one first color sub-pixel 110 is arranged between two closest sub-pixels 100 respectively in two adjacent sub-pixel groups 1000 arranged along the row direction, and one first color sub-pixel 110 is arranged between two closest sub-pixels 100 respectively in two adjacent sub-pixel groups 1000 arranged along the column direction.

For example, as shown in FIG. 1, each sub-pixel group 1000 includes one first color sub-pixel 110, four second color sub-pixels 120 surrounding the one first color sub-pixel 110, and four third color sub-pixels 130 surrounding the one first color sub-pixel 110. The first angle portion 1011 of at least one color sub-pixel of the third color sub-pixel 130 and the second color sub-pixel 120 faces the first color sub-pixel 110. For example, the first angle portions 1011 of the third color sub-pixel 130 and the second color sub-pixel 120 face the first color sub-pixel 110. For example, the angle portions at the edges of each sub-pixel group 1000 are not the first angle portions 1011, and the arrangement of the sub-pixel groups 1000 is similar to a third-order Magic structure.

For example, as shown in FIG. 1, in at least part of the sub-pixel groups 1000, the four angle portions of the first color sub-pixel 110 are all the first angle portions 1011, the four angle portions of the second color sub-pixel 120 include two first angle portions 1011, and the first angle portions 1011 of the third color sub-pixel 130 and the second color sub-pixel 120 face the first color sub-pixel 110.

For example, as shown in FIG. 1 and FIG. 5, the number of first angle portions included in the second color sub-pixel can be one or two, but it is not limited thereto, and the second color sub-pixel may not include any first angle portion, or may include three or four first angle portions; and the distribution of the first angle portions in the second color sub-pixel can be set according to the actual product requirements.

Figure 9:
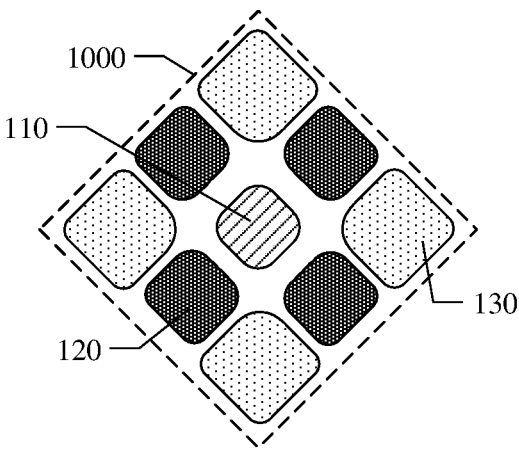
FIG. 9 is a schematic diagram of another sub-pixel group provided by an embodiment of the present disclosure.

For example, FIG. 9 is a schematic diagram of another sub-pixel group provided by an embodiment of the present disclosure. The sub-pixel group 1000 shown in FIG. 9 differs from the sub-pixel group 1000 shown in FIG. 1 in that in the present example, the connecting lines between the intersections of the extension lines of the sides of the second color sub-pixel 120 in the sub-pixel group 1000 form a rhombus. For example, a diagonal of the rhombus is parallel to at least one of the row direction and the column direction. For example, the ratio of the area of the light emitting region of the second color sub-pixel 120 to the area of the light emitting region of the third color sub-pixel 130 can be in the range of 0.8-1.2. For example, the ratio of the area of the light emitting region of the second color sub-pixel 120 to the area of the light emitting region of the first color sub-pixel can be in the range of 0.8-1.2.

For example, the distribution rule of the first angle portions of the second color sub-pixel 120 shown in FIG. 9 can be the same as the distribution rule of the first angle portions of the second color sub-pixel 120 shown in FIGS. 1-8, without being repeated here. The distribution rule of the first angle portions of the remaining color sub-pixels shown in FIG. 9 can be the same as the distribution rule of the first angle portions of the remaining color sub-pixels shown in FIGS. 1-8, without being repeated here.

For example, in the display substrate provided by the embodiments of the present disclosure, among the first color sub-pixel, the second color sub-pixel and the third color sub-pixel, one color sub-pixel may not include the first angle portion, and the remaining two color sub-pixels may include different counts of first angle portions. For example, the sub-pixel excluding the first angle portion may be a red sub-pixel, a green sub-pixel or a blue sub-pixel, without being limited in the embodiments of the present disclosure.

For example, in an example of an embodiment of the present disclosure, the sub-pixels located at the outermost edge of the display region of the display substrate can include a row or column of first color sub-pixels and third color sub-pixels alternately arranged, and the first angle portions of the row or column of sub-pixels located at the outermost edge can all face the outer side of the display region, so as to alleviate the phenomenon that the edge appears purple in the case where the display substrate is displaying, and be helpful to improve the feeling of jagged edge of the display region.

For example, in an example of an embodiment of the present disclosure, the sub-pixels located at the outermost edge of the display region of the display substrate can include a row or column of second color sub-pixels, and the first angle portions of the row or column of second color sub-pixels located at the outermost edge can all face the outer side of the display region, so as to alleviate the phenomenon that the edge appears cyan in the case where the display substrate is displaying, and be helpful to improve the feeling of jagged edge of the display region.

The embodiments of the present disclosure are not limited to the case in which the side connecting adjacent angle portions in the light emitting region is a straight side, and for example, it can also be a curved side, such as a curved side that is concave inward or convex outward; and the length of the side connecting adjacent angle portions can also refer to the length of the curved side, and the curved side refers to the part at an outer side of the end points of the rounded angle.

For example, the embodiments of the present disclosure are not limited to the case in which the shape of the second color sub-pixel is a rectangle, and the shape of the second color sub-pixel can also be an oval, an olive-shape (e.g., a shape with a large width in the middle and small widths at both ends), etc.

Another embodiment of the present disclosure provides a display device, which includes the display substrate described above.

In the display device provided by the embodiment of the present disclosure, the counts of the first angle portions in at least two different color sub-pixels are set to be different, which is helpful to adjust the brightness centers of at least part of the display regions to make the distribution of the brightness centers more uniform.

For example, the display device provided by the embodiments of the present disclosure can be a light emitting diode display device.

For example, the display device can further include a cover plate located on a display side of the display substrate.

For example, the display device can be any product or component with display function, such as a TV, a digital camera, a mobile phone, a watch, a tablet computer, a notebook computer, a navigator, etc., and the embodiments are not limited thereto.

For example, the display device can be a display device with an under screen camera, which includes a functional component, such as at least one of a camera module (for example, a front camera module), a 3D structured light module (for example, a 3D structured light sensor), a time-of-flight 3D imaging module (for example, a time-of-flight sensor), and an infrared sensing module (for example, an infrared sensor), etc.

The following statements should be noted:

(1) The accompanying drawings related to the embodiment(s) of the present disclosure involve only the structure(s) in connection with the embodiment(s) of the present disclosure, and other structure(s) can be referred to common design(s).

(2) In case of no conflict, features in one embodiment or in different embodiments of the present disclosure can be combined.

What have been described above are only specific implementations of the present disclosure, and the protection scope of the present disclosure is not limited thereto. Therefore, the protection scope of the present disclosure should be determined based on the protection scope of the claims.

What is claimed is:

1. A display substrate, comprising:

a plurality of sub-pixels, comprising a plurality of first color sub-pixels, a plurality of second color sub-pixels and a plurality of third color sub-pixels; wherein the plurality of first color sub-pixels and the plurality of third color sub-pixels are alternately arranged along a row direction and a column direction to form a plurality of first pixel rows and a plurality of first pixel columns, the plurality of second color sub-pixels are arrayed along the row direction and the column direction to form a plurality of second pixel rows and a plurality of second pixel columns, the plurality of first pixel rows and the plurality of second pixel rows are alternately arranged along the column direction and are shifted from each other in the row direction, and the plurality of first pixel columns and the plurality of second pixel columns are alternately arranged along the row direction and are shifted from each other in the column direction;

wherein the plurality of sub-pixels comprise a plurality of light emitting regions, sides of each light emitting region or extension lines of the sides of each light emitting region are sequentially connected to form a polygon, and a plurality of vertex angles in the polygon of at least part of the plurality of sub-pixels have non-overlapped regions with a plurality of angle portions of a corresponding light emitting region;

the plurality of angle portions of the light emitting region of at least one sub-pixel at least comprise a first angle portion, an area of a non-overlapped region between the first angle portion and a vertex angle of the polygon corresponding to the first angle portion is greater than an area of a non-overlapped region between each angle portion among at least part of remaining angle portions and a vertex angle of the polygon corresponding to the each angle portion;

a shape of the light emitting region is a shape of the polygon with at least one vertex angle cut off, and the first angle portion is an angle portion of the polygon with a first vertex angle formed by two first sides cut off, and a ratio of a length of a cut-off part of at least one of the two first sides to a length of the first side is in a range of 0.2-0.8;

angle portions of light emitting regions of each of at least two different color sub-pixels comprise the first angle portion, and counts of first angle portions in the at least two different color sub-pixels are different.

2. The display substrate according to claim 1, wherein light emitting regions of sub-pixels of a same color have a same area, and light emitting regions of sub-pixels of different colors have different areas.

3. The display substrate according to claim 1, wherein sides of the light emitting region of the first color sub-pixel or extension lines of the sides of the light emitting region of the first color sub-pixel are sequentially connected to form a first polygon, sides of the light emitting region of the second color sub-pixel or extension lines of the sides of the light emitting region of the second color sub-pixel are sequentially connected to form a second polygon, sides of the light emitting region of the third color sub-pixel or extension lines of the sides of the light emitting region of the third color sub-pixel are sequentially connected to form a third polygon, and at least two of the first polygon, the second polygon and the third polygon are similar patterns.

4. The display substrate according to claim 1, wherein, in a same sub-pixel, a shortest distance between two straight sides connected to two ends of the first angle portion is not greater than a length of a connecting line between vertices of two angle portions both adjacent to the first angle portion in the same sub-pixel.

5. The display substrate according to claim 1, wherein lengths of the two straight sides connected to the two ends of the first angle portion are not less than 3 microns.

6. The display substrate according to claim 1, wherein the light emitting region of at least one sub-pixel with the first angle portion is an axisymmetric pattern, and at least one axis of symmetry in the axisymmetric pattern coincides with a bisector of the first angle portion.

7. The display substrate according to claim 1, wherein, in a same sub-pixel, a connecting line between vertices of two angle portions adjacent to the first angle portion divides the same sub-pixel into two parts, and the two parts have different areas.

8. The display substrate according to claim 1, wherein, in a same sub-pixel, a connecting line between vertices of two angle portions adjacent to the first angle portion divides the sub-pixel into two parts, and an area ratio of the two parts is in a range of 0.1-10.

9. The display substrate according to claim 7, wherein the third color sub-pixel comprises the first angle portion, a connecting line between vertices of two angle portions adjacent to the first angle portion divides the third color sub-pixel into a first part and a second part, the first part comprises the first angle portion, and an area of the first part is less than an area of the second part;

a luminous efficiency of the third color sub-pixel is less than a luminous efficiency of the second color sub-pixel, and the second part of the third color sub-pixel is closer to the second color sub-pixel driven in the same row as the third color sub-pixel and adjacent to the third color sub-pixel.

10. The display substrate according to claim 1, wherein one sub-pixel comprises the first angle portion, another sub-pixel of a different color adjacent to the one sub-pixel in at least one of the row direction and the column direction does not comprise the first angle portion, or angle portions included in the light emitting region of the another sub-pixel of a different color are all the first angle portions, a connecting line between geometric centers of light emitting regions of the one sub-pixel and the another sub-pixel of a different color adjacent to the one sub-pixel is not parallel to the row direction or the column direction.

11. The display substrate according to claim 1, wherein all of the first color sub-pixel, the second color sub-pixel and the third color sub-pixel comprise the first angle portions, and sub-pixels of different colors have different counts of first angle portions.

12. The display substrate according to claim 1, wherein, in at least one kind of the first color sub-pixel, the second color sub-pixel and the third color sub-pixel, angle portions of the light emitting region further comprise a second angle portion, and a distance between an intersection of two sides connecting two endpoints of the first angle portion or extension lines of the two sides connecting two endpoints of the first angle portion and a geometric center of the light emitting region of the sub-pixel is greater than a distance between an intersection of two sides constituting the second angle portion or extension lines of the two sides constituting the second angle portion and the geometric center.

13. The display substrate according to claim 12, wherein a shape of an outer edge of the first angle portion comprises a line segment, and a ratio of lengths of the outer edges of the first angle portions in different color sub-pixels is in a range of 0.8-1.2; or the shape of the outer edge of the first angle portion comprises an arc, and a ratio of radians of the outer edges of the first angle portions in different color sub-pixels is in a range of 0.8-1.2.

14. The display substrate according to claim 13, wherein the second angle portion is an angle portion of the polygon with a second vertex angle formed by two second sides cut off or with a second vertex angle formed by one first side and one second side cut off, and a ratio of a length of a cut-off part of at least one side of the first side and the second side to a length of the at least one side is in a range of 0.05-0.2.

15. The display substrate according to claim 14, a shape of an outer edge of the second angle portion comprises a line segment, and a ratio of lengths of the outer edges of the second angle portions in different color sub-pixels is in a range of 0.8-1.2; or the shape of the outer edge of the second angle portion comprises an arc, and a ratio of radians of the outer edges of the second angle portions in different color sub-pixels is in a range of 0.8-1.2.

16. The display substrate according to claim 12, wherein, among angle portions of at least part of the light emitting regions, the angle portions other than the first angle portion are the second angel portions.

17. The display substrate according to claim 12, wherein at least part of the light emitting regions comprises four angle portions, the four angle portions of one color sub-pixel of the first color sub-pixel, the second color sub-pixel and the third color sub-pixel do not comprise the first angle portion, and the four angle portions of the remaining two color sub-pixels of the first color sub-pixel, the second color sub-pixel and the third color sub-pixel comprise different counts of the first angle portions; or, the four angle portions of two color sub-pixels of the first color sub-pixel, the second color sub-pixel and the third color sub-pixel comprise same count of first angle portions, and the four angle portions of the remaining one color sub-pixel comprise a count of the first angle portions different from the count of the first angle portions of the two color sub-pixels; or, the four angle portions of each of the first color sub-pixel, the second color sub-pixel and the third color sub-pixel comprise the first angle portions, and different color sub-pixels comprise different counts of the first angle portions.

18. A display device, comprising the display substrate according to claim 1.

\* \* \* \* \*